(12) United States Patent
Hsu et al.

(10) Patent No.: US 8,331,150 B2
(45) Date of Patent: Dec. 11, 2012

(54) INTEGRATED SRAM AND FLOTOX EEPROM MEMORY DEVICE

(75) Inventors: Fu-Chang Hsu, San Jose, CA (US); Peter Wung Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 784 days.

(21) Appl. No.: 12/319,241

(22) Filed: Jan. 5, 2009

(65) Prior Publication Data

US 2009/0190402 A1    Jul. 30, 2009

Related U.S. Application Data

(60) Provisional application No. 61/009,892, filed on Jan. 3, 2008.

(51) Int. Cl.
*G11C 14/00* (2006.01)

(52) U.S. Cl. ......... 365/185.08; 365/185.18; 365/185.29; 365/189.05

(58) Field of Classification Search ............. 365/185.08, 365/185.18, 185.29, 154, 189.05
See application file for complete search history.

(56) References Cited

U.S. PATENT DOCUMENTS

| | | | |
|---|---|---|---|
| 5,488,579 A | 1/1996 | Sharma et al. | |
| 6,097,629 A | 8/2000 | Dietrich et al. | |
| 7,164,608 B2 | 1/2007 | Lee | |
| 7,164,808 B2 | 1/2007 | Srinivasa | |
| 7,280,397 B2 | 10/2007 | Scheuerlein | |
| 2005/0128805 A1 | 6/2005 | Lee et al. | |
| 2006/0023503 A1* | 2/2006 | Lee | 365/185.05 |
| 2006/0138245 A1 | 6/2006 | Lee | |
| 2007/0158737 A1 | 7/2007 | Yang et al. | |
| 2008/0151643 A1 | 6/2008 | Ashokkumar et al. | |
| 2008/0151654 A1 | 6/2008 | Allan et al. | |
| 2008/0158981 A1 | 7/2008 | Johal et al. | |
| 2008/0247230 A1 | 10/2008 | Lee et al. | |

FOREIGN PATENT DOCUMENTS

WO    2009/000792    3/2009

* cited by examiner

*Primary Examiner* — Toan Le
(74) *Attorney, Agent, or Firm* — Saile Ackerman LLC; Stephen B. Ackerman; Billy Knowles

(57) ABSTRACT

A nonvolatile SRAM circuit has an SRAM cell and one or two FLOTOX EEPROM cells connected to the data storage terminals of the SRAM cell. In programming to a first data level, the threshold voltage of a FLOTOX EEPROM transistor is brought to a programmed voltage level greater than a read voltage level and erasing to a second data level, the threshold voltage of the FLOTOX EEPROM transistor is brought to an erased voltage level less than the read voltage level. The nonvolatile SRAM array provides for restoring data to an SRAM cell from a FLOTOX EEPROM memory cell(s) at a power initiation and storing data to the FLOTOX EEPROM memory cell(s) to the SRAM cell at power termination. A power detection circuit for providing signals indicating power initiation and power termination to instigate restoration and storing of data between an SRAM cell and a FLOTOX EEPROM cell(s).

90 Claims, 9 Drawing Sheets

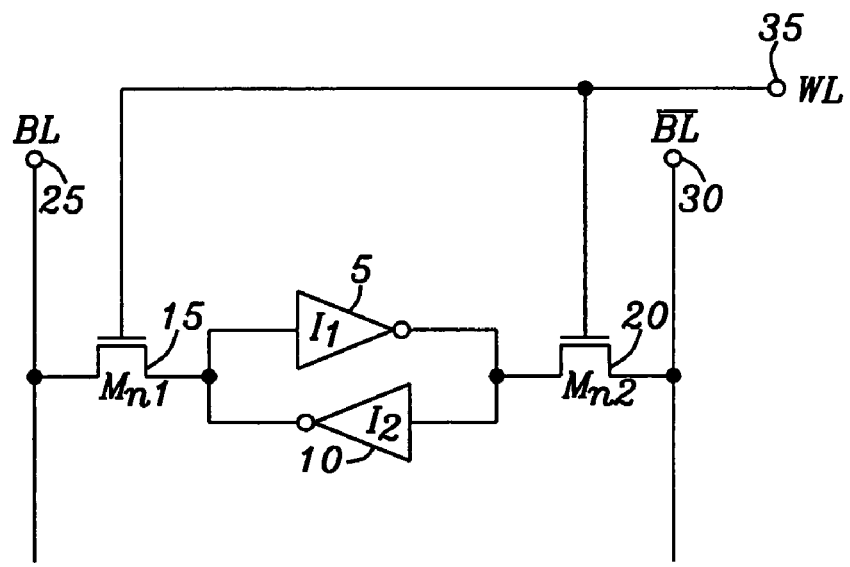
*FIG. 1a – Prior Art*
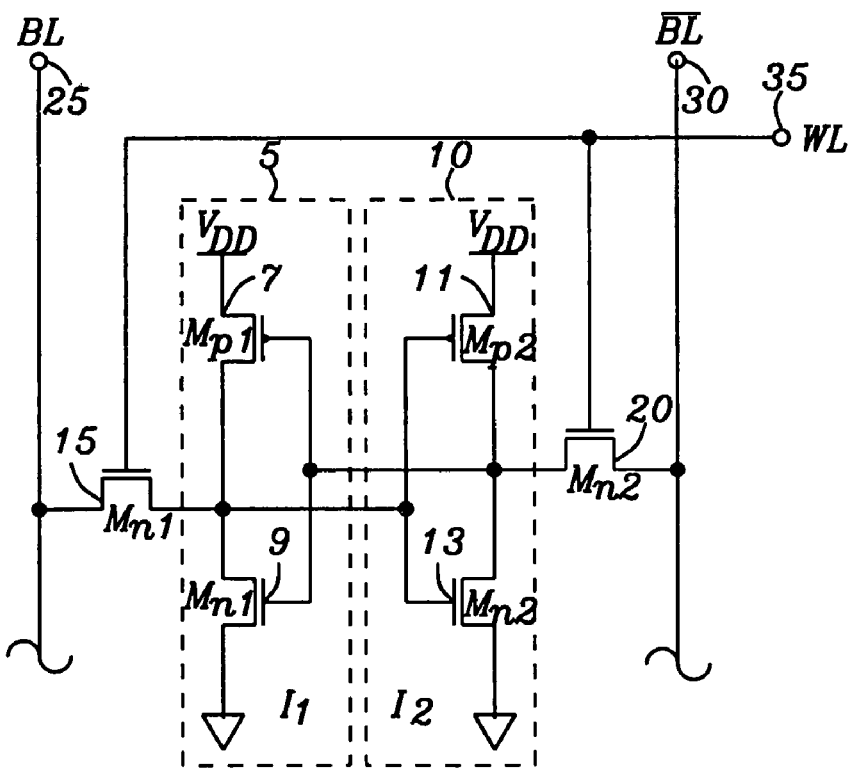
*FIG. 1b – Prior Art*

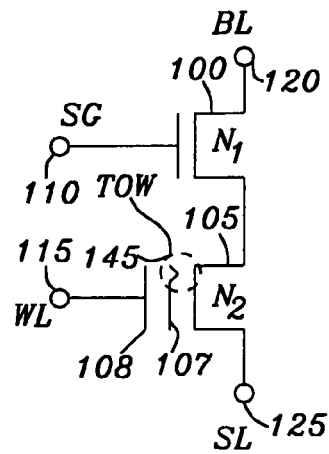
FIG. 2a – Prior Art
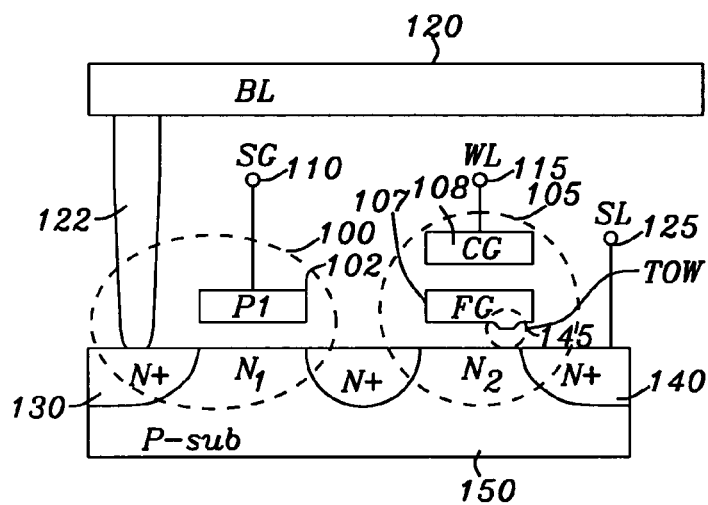
FIG. 2b – Prior Art
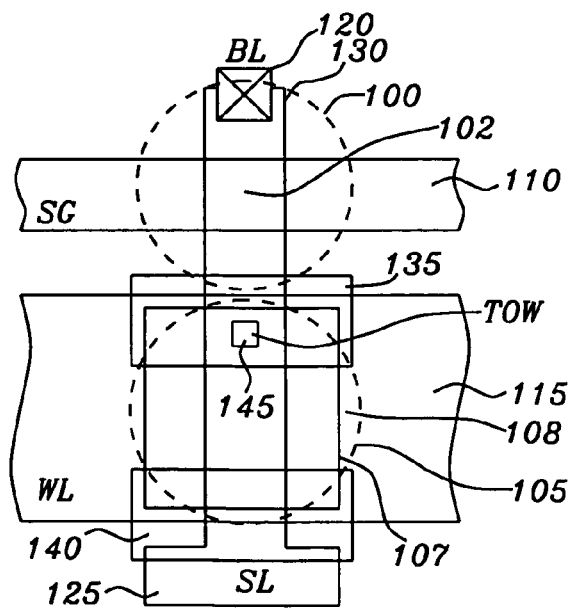
FIG. 2c – Prior Art

| | BL | $\overline{BL}$ | SWL | Q | $\overline{Q}$ | SG1 | SG2 | EEWL | EESL |
|---|---|---|---|---|---|---|---|---|---|
| RESTORE EEPROM into SRAM | X | X | 0V | EEPROM data | EEPROM data | VPP | VPP | VREAD | VDD |
| Erase EEPROM | X | X | 0V | X | X | 0V | VPP | 0 | VPP |
| Write SRAM | DATA VDD/0V | DATA VDD/0V | VDD | DATA VDD/0V | DATA VDD/0V | 0V | 0V | 0V | 0V/FLOAT |
| Read SRAM | DATA VDD/0V | DATA VDD/0V | VDD | DATA VDD/0V | DATA VDD/0V | 0V | 0V | 0V | 0V/FLOAT |
| Program SRAM into EEPROM | X | X | 0V | DATA VDD/0V | DATA VDD/0V | VDD | 0V | VPP | 0V/FLOAT |

X = DON'T CARE

INTEGRATED SRAM AND FLOTOX EEPROM MEMORY DEVICE

This application claims priority under 35 U.S.C. §119 to U.S. Provisional Patent Application Ser. No. 61/009,892, filed on Jan. 3, 2008, which is herein incorporated by reference in its entirety.

BACKGROUND OF THE INVENTION

1. Field of the Invention

This invention relates generally to random access memory (RAM) circuits. More particularly, this invention relates to static RAM circuits. Even more particularly, this invention relates to integrated nonvolatile static RAM (NVSRAM) circuits where the nonvolatile memory element is a floating gate tunnel oxide (FLOTOX) nonvolatile memory device.

2. Description of Related Art

In the semiconductor industry, generally, there are two important kinds of CMOS memories such as "volatile" and "non-volatile". The "volatile" memory (VM), in which the stored data would not be retained when its low-voltage VDD power supply is removed or shut down. The VM memories include Static Random Access Memory (SRAM) and Dynamic Random Access Memory (DRAM). The SRAM has the largest cell size because it is formed from six (6) CMOS transistors, i.e. 2 PMOS and 4 NMOS.

The DRAM conversely has a small cell size because it has only one NMOS switching transistor connected in series with a capacitor that is used to store the charge of data. The feature size of both SRAM and DRAM volatile memories allow low-voltage CMOS devices that have a very fast read and write speed in 20 ns range. During repeat read and write operation, SRAM does not need refresh cycle as with a DRAM.

The SRAM, as is well known in the art, consists of a bistable transistor flip-flop or latching circuit. Referring to FIGS. 1a and 1b, the inverters $I_1$ 5 and $I_2$ 10 are coupled such that the output of the inverter $I_1$ 5 is connected to the input of the inverter $I_2$ 10 and the output of the inverters $I_2$ 10 is connected to the input of the inverter $I_1$ 5 to form the bistable latch. The access transistor $M_{a1}$ 15 has a drain terminal connected to the input of the inverter $I_1$ 5 and the output of the inverter $I_2$ 10 and a source terminal connected to the bit line BL 25. The access transistor $M_{a2}$ 20 has a drain terminal connected to the input of the inverter $I_2$ 10 and the output of the inverter $I_1$ 5 and a source terminal connected to the bit line $\overline{BL}$ 30. The gates of the access transistors $M_{a1}$ 15 and $M_{a2}$ 20 are connected to the word line WL 35 to receive the activation signals for accessing the memory cell.

In operation, the bit lines BL 25 and $\overline{BL}$ 30 are precharged respectively to the data to be written or read from the memory cell. The word Line WL 35 is set to a voltage level sufficient to activate the access transistors $M_{a1}$ 15 and $M_{a2}$ 20 and the digital signal representative of the binary data to be written to or read from the memory cell is transferred to or from the memory cell.

The inverter $I_1$ 5 consists of the n-type MOS transistor $M_{n1}$ 9 and the p-type MOS transistor $M_{p1}$ 7 configured as the well known CMOS inverter. Similarly the inverter $I_2$ 10 consists of the n-type MOS transistor $M_{n2}$ 13 and the p-type MOS transistor $M_{p2}$ 11 also configured a CMOS inverter. The gates of the n-type MOS transistor $M_{n1}$ 9 and the p-type MOS transistor $M_{p1}$ 7 are connected to the common drain connection of the n-type MOS transistor $M_{n2}$ 13 and the p-type MOS transistor $M_{p2}$ 11 and the gates of the n-type MOS transistor $M_{n2}$ 13 and the p-type MOS transistor $M_{p2}$ 11 are connected to the common drain connection of the n-type MOS transistor $M_{n1}$ 9 and the p-type MOS transistor $M_{p1}$ 7. This forms the cross-connection to create the bistable flip-flop. The sources of the gates of the n-type MOS transistor $M_{n1}$ 9 and the p-type MOS transistor $M_{p1}$ 7 are connected to the common drain connection of the n-type MOS transistors $M_{n2}$ 13 and $M_{n1}$ 9 are connected to the ground reference voltage source and the sources of the p-type MOS transistors $M_{p1}$ 7 and $M_{p2}$ 11 are connected to the power supply voltage source VDD.

As stated above, the bit lines BL 25 and $\overline{BL}$ 30 are precharged for performing desired writing and read from the SRAM cell. For instance if the digital signals representing a binary 1 are to be written to the SRAM cell, the bit line BL 25 is set to the voltage of the power supply voltage source VDD less a voltage threshold $V_T$ of an MOS transistor and the bit line $\overline{BL}$ 30 is set to essentially the ground voltage level. The word Line WL 35 is set to a voltage level sufficient to activate the access transistors $M_{a1}$ 15 and $M_{a2}$ 20. The digital signal representing the binary "1" turns on the n-type MOS transistor $M_{n2}$ 13 and turns off the p-type MOS transistor $M_{p2}$ 11. The complementary binary "0" present at the bit line $\overline{BL}$ 30 turns on the p-type MOS transistor $M_{p1}$ 7 and turns off the n-type MOS transistor $M_{n1}$ 9, thus setting the flip-flop For reading the SRAM cell, the bit lines BL 25 and $\overline{BL}$ 30 are precharged to a level approximately equal to one half of the voltage level of the power supply voltage source VDD and the word Line WL 35 is set to the voltage level sufficient to activate the access transistors $M_{a1}$ 15 and $M_{a2}$ 20. The digital signals present at the drains of the n-type MOS transistor $M_{n1}$ 9 and the p-type MOS transistor $M_{p1}$ 7 are transferred to the bit line BL 25 and the digital signals present at the n-type MOS transistor $M_{n2}$ 13 and the p-type MOS transistor $M_{p2}$ 11 is transferred to the bit line $\overline{BL}$ 30. The bit lines BL 25 and $\overline{BL}$ 30 are connected to a bit line sense amplifier to regenerate the binary data.

The "non-volatile" memory (NVM), in which the stored data would not be corrupted and normally is retained for more than 20 years even after the power supply voltage source (VDD) is completely disconnected. Today, there are many different kinds of NVM memories aimed for different applications. For example, the most popular NVM today is NAND flash with a very small cell size of about 0.5 T cell size of $4\lambda^2$ ($\lambda^2$ being the smallest area capable for a given semiconductor process) and is generally used to store huge blocks of data necessary for audio and video serial applications. The highest available memory density is up to 16 Gb and is currently made of 45 nm in 2007. The second largest revenue of NVM is NOR flash with one-transistor cell of about $10\lambda^2$ and is used to store the program code. Today, the highest available NOR memory density is about 2 Gb in the market place and is made of 70 nm in 2007. The third type of NVM is 2-transistor floating gate tunnel oxide (FLOTOX) EEPROM with cell size of about $80\lambda^2$. Currently, the density of EEPROM is around 1 Mb only and is used in byte-alterable application. Unlike NAND and NOR Flash Ram that only allows big-block data alterability, EEPROM can achieve the largest number of program/erase (P/E) cycles. In the current design, the EEPROM is capable of 1 M P/E cycles when accomplished in units of bytes for small data change applications.

There are several disadvantages for NVM. The on-chip, high-voltage devices, charge-pump circuits, and the complicated double-polycrystalline silicon cell structure are required for the basic erase and program operations. Secondly, these NVM cell's program and erase operations cannot be performed as fast as its read operation. Typically, the required Program and Erase operation speed for the above NVM memories ranges from few hundred μs to few ms but only requires less than 50 ns for Read operation. In EEPROM terminology, Write means program plus erase operation. Typically, the write takes much longer than read so that it becomes the bottleneck in many applications.

The data retained in an SRAM memory cell is volatile, in that any interruption of the power supply voltage source causes a loss of the data. An alternative to the volatile SRAM is the nonvolatile RAM. One nonvolatile RAM consists of a floating gate transistor which has a charge placed on a floating gate to modify the voltage threshold $V_T$ of the floating gate transistor that indicates the state of the binary data retained in the nonvolatile RAM cell. The cell structure and application of the nonvolatile RAM is well known in the art. The non-volatile RAM has three classifications the Electrically Programmable Read Only Memory (EPROM), Electrically Erasable and Programmable Read Only Memory (EEPROM), and the flash Electrically Erasable and Programmable Read Only Memory (Flash). The EPROM is programmed by electrically forcing charge to the floating gate. Ultra-violet light is employed to eliminate (erase) the electrical charges of the programming from the floating gate of the EPROM. During EPROM program operation, in addition to a low-voltage power supply (VDD), an external high-voltage programming power supply (VPP) of about 12V is used. With a sealed package, UV-light cannot reach floating-gate, thus the erase operation is blocked and the EPROM is considered a One Time Programmable (OTP) EPROM. If the sealed OTP is changed to sealed Flash, then both erase and program operations can be performed electrically and repeatedly in system without the overheads of UV-light exposure and the external VPP programmer due to Flash's on-chip charge pump that can generate high voltage internally.

The Flash type nonvolatile RAM offers a medium read speed of around 50 ns but a very slow write speed of a few milliseconds (ms). The reason for such a slow write speed in today's flash memory cells are mainly due to its slow program and erase schemes based on device Fowler-Nordheim tunneling. The Fowler-Nordheim tunneling effect allows the electrons to be injected into or removed from flash's floating gate that is used to store the data. In order to have a successful Fowler-Nordheim tunneling effect, the electric field across the tunneling oxide has to be maintained larger than 10V/cm. That is the reason why most of the flash memory requires a charge pump to generate on-chip high-voltage for erase and program operations.

FIG. 2a illustrates the schematic circuit for a 2-transistor, CMOS, FLOTOX EEPROM cell of the prior art. The EEPROM cell of the prior art includes of two transistors 100 and 105. The select transistor, $N_1$ 100 is a Polysilicon NMOS device with its gate connected to a select gate signal SG 110. The source of the select transistor is connected to the drain of the floating gate tunnel oxide (FLOTOX) EEPROM cell $N_2$ 105. The FLOTOX EEPROM cell $N_2$ 105 is a double polysilicon floating gate device. A first layer of polysilicon is the floating-gate 107 that is used to store the charges representing the binary "0" and binary "1" of the stored data. The second layer of the polysilicon is a control gate 108 that is connected to the word line WL 115. The drain of the select transistor $N_1$ 100 is connected to a vertical and global metal bit line BL 120. The source of the EEPROM cell $N_2$ 105 is connected to a common source line SL 125.

FIGS. 2b and 2c illustrate the physical layout for the two-transistor FLOTOX EEPROM circuit of FIG. 2a of the traditional two-transistor FLOTOX EEPROM cell as formed in a substrate 150. A first layer polysilicon conductor forms the select gate 110 and runs horizontally in parallel with a second level polysilicon conductor that forms the word line WL 115. The overlapping area of a first layer polysilicon conductor 102 and $N^+$ active layers 130 and 135 form a polysilicon NMOS select transistor $N_1$ 100. The drain region 130 of the select transistor 100 has a half-contact 122 for the connection with the global metal bit line BL 120. The FLOTOX EEPROM cell $N_2$ 105 is a double-poly floating gate device and is formed above the $N^+$ layers 135 and 140. The first layer polysilicon conductor 107 forms the floating gate and is placed below the second layer polysilicon conductor 108 that forms the control gate. A square box of a tunnel window layer of TOW 145 has about 100 Å thickness to allow Fowler-Nordheim programming and erasing during the normal write operation of the FLOTOX EEPROM cell $N_2$ 105. In traditional FLOTOX EEPROM cell, a write operation is comprised of two self-timed Fowler-Nordheim tunneling steps. The first step is Fowler-Nordheim tunneling erase and then follows the second step of FN tunneling program. In traditional EEPROM write operation, the erase operation takes about 0.5 ms and program also takes about same 0.5 ms typically. The FLOTOX EEPROM cell's $N_2$ 105 threshold voltage ($V_t$) will be increased to around +2V with data of "1" after erase. But after the subsequent Fowler-Nordheim program operation, the selected FLOTOX EEPROM cell's $N_2$ 105 is programmed by decreasing the threshold voltage ($V_t$) to about −2V with data of a binary "0". The deselected programmed cell's threshold voltage ($V_t$) will remain unchanged at +2V with data of a binary "1".

U.S. Pat. No. 5,488,579 (Sharma, et al.) details a nonvolatile SRAM cell that includes a six-transistor SRAM cell and a three-transistor nonvolatile memory portion. The nonvolatile memory portion is connected to one storage node of the SRAM cell portion.

U.S. Pat. No. 6,097,629 (Dietrich, et al.) describes a nonvolatile, static random access memory (nvSRAM) device that is capable of high speed copying of the data in the static random access portion of the device into the non-volatile portion of the device after the detection of possible loss of power. This is accomplished by preparing the non-volatile portion for receiving a bit of data from the SRAM portion before the possible loss of power is detected, i.e., pre-arming the device. The pre-arming is accomplished by erasing the non-volatile portion immediately after power has been provided to the device and data from the non-volatile portion has been copied into the SRAM in a recall operation.

U.S. Pat. No. 7,280,397 (Scheuerlein) provides a shadow RAM or "non-volatile SRAM" memory cell. The memory cell includes a pair of cross-coupled devices disposed on a first device layer and defining a pair of internal cross-coupled nodes, and a pair of non-volatile storage devices disposed on a second device layer above or below the pair of cross-coupled devices and coupled to the cross-coupled nodes.

U.S. Patent Application 2008/0151643 (Ashokkumar, et al.) and U.S. Patent Application 2008/0151654 (Allan, et al.) illustrate a non-volatile SRAM cell that has a volatile portion and a non-volatile portion. Each tri-gate structure in the non-volatile portion has a recall transistor, a store transistor and at least one SONOS transistor. The volatile portion has an SRAM cell comprising six transistors with two back-to-back inverters forming the latch and two pass transistors gated by the word-line signal which connect the bit-line true to the data true node of the latch and the bit-line complement to the data complement node of the latch, a word line, a node supplying power to the SRAM cell and a bit line pair with a first bit line and a second bit line. The first and second SONOS transistors are programmed so that the first tri-gate having the first SONOS transistor is configured in an erased condition and the second tri-gate structure having the second SONOS transistor is configured in a programmed condition. The volatile portion is isolated from the non-volatile portion by turning off a first store transistor in the first tri-gate structure and turning off a second store transistor in the second tri-gate structure.

U.S. Patent Application (2008/0158981) Johal, et al. describes a non-volatile SRAM cell that has a volatile portion and a non-volatile portion and provides a method and apparatus for on chip sensing of SONOS threshold voltage $V_T$ window in the non-volatile portion.

There is a need to have a random access memory that offers the same fast read and write speed as conventional SRAM in 10 ns range and while retaining the non-volatility of flash to retain its data when power loss occurs.

SUMMARY OF THE INVENTION

An object of this invention is to provide a nonvolatile SRAM circuit having an SRAM cell and one FLOTOX EEPROM cell connected to a data terminal of the SRAM cell.

Another object of this invention is to provide a nonvolatile SRAM circuit having an SRAM cell and two FLOTOX EEPROM cells connected respectively to a data terminal and a complementary data terminal of the SRAM cell.

Further, another object of this invention is to provide a nonvolatile SRAM circuit wherein programming to a first data level (binary "0"), the threshold voltage of a FLOTOX EEPROM transistor is brought to a voltage level (+2.0V) greater than a read voltage level; and Still further, another object of this invention is to provide a nonvolatile SRAM circuit wherein erasing to a second data level (binary "1"), the threshold voltage of a FLOTOX EEPROM transistor is brought to a voltage level less than a read voltage level (−2.0V).

Even further, an object of this invention is to provide a nonvolatile SRAM array for restoring data to an SRAM cell from a FLOTOX EEPROM memory cell(s) at a power initiation and storing data to the FLOTOX EEPROM memory cell(s) to the SRAM cell at power termination.

Even still further, an object of this invention is to provide a power detection circuit for providing signals indicating power initiation and power termination to instigate restoration and storing of data between an SRAM cell and a FLOTOX EEPROM cell(s).

To accomplish at least one of these objects, a nonvolatile static random access memory array is formed of a plurality of integrated nonvolatile static random access memory circuits arranged in an array of rows and columns. Each of the integrated nonvolatile static random access memory circuit has a static random access memory cell and a first floating gate tunnel oxide EEPROM element. The static random access memory cell has a latched memory element to retain a digital signal indicative of a data bit at a first data terminal and a complementary digital signal indicative of a complementary data bit a second data terminal. A first access transistor is connected to allow control access of a bit line and a second access transistor is connected to allow control access of a complementary bit line to the latched memory element for writing and reading the digital signal to and from the latched memory element. The first and second access transistors have control gates in communication with an SRAM word line for controlling access of the latched memory element to the first and second bit lines.

The first floating gate tunnel oxide EEPROM element is connected to the latched memory element through the first data terminal to receive and permanently retain the digital signal from the latched memory element. The first floating gate tunnel oxide EEPROM element includes a first floating gate tunnel oxide transistor and two select gating transistors. The first floating gate tunnel oxide transistor includes an EEPROM control gate connected an EEPROM word line for controlling activation of the first floating gate tunnel oxide transistor and a floating gate for permanently retaining charge representing the digital signal. The first select gating transistor has a drain connected to the first data terminal, a source connected to a drain of the floating gate tunnel oxide transistor, and a control gate connected to a first select gating signal for controlling access to the floating gate tunnel oxide transistor. The second select gating transistor has a drain connected to a source of the floating gate tunnel oxide transistor, a source connected to a source line, and a control gate connected to a second select gating signal for controlling access to the floating gate tunnel oxide transistor from the source line.

When the first floating gate tunnel oxide EEPROM element is programmed to a first data level, the threshold voltage of the first floating gate tunnel oxide transistor is increased to a voltage level (+2.0V) above a read voltage level. Alternately, when the first floating gate tunnel oxide EEPROM element is erased to a second data level, the threshold voltage of the first floating gate tunnel oxide transistor is increased to a voltage level (−2.0V) less than a read voltage level.

Each of the integrated nonvolatile static random access memory circuits further a second floating gate tunnel oxide EEPROM element in communication with the latched memory element through the second data terminal to receive and permanently retain a complement of the digital signal from the latched memory element. The second floating gate tunnel oxide EEPROM element includes a second floating gate tunnel oxide transistor. The second floating gate tunnel oxide EEPROM element includes a control gate for controlling activation of the second floating gate tunnel oxide transistor and a floating gate for permanently retaining charge representing the complement of the digital signal. The second floating gate tunnel oxide EEPROM element includes third select gating transistor and a fourth select gating transistor. The third select gating transistor has a source connected to a drain of the second floating gate tunnel oxide transistor, a drain connected to the second data terminal, and a control gate connected to a first select gating signal for controlling access to the second floating gate tunnel oxide transistor. The fourth select gating transistor has a drain connected to a source of the second floating gate tunnel oxide transistor, a source connected to the source line, and a control gate connected to the second select gating signal for controlling access to the second floating gate tunnel oxide transistor from the source line.

When the second floating gate tunnel oxide EEPROM element is programmed, the threshold voltage of the second floating gate tunnel oxide transistor is increased to a voltage level (+2.0V) above the read voltage level. When the second floating gate tunnel oxide EEPROM element is erased, the threshold voltage of the second floating gate tunnel oxide transistor to a voltage level (−2.0V) less than the read voltage level.

The control gate of the first floating gate tunnel oxide transistor or the second floating gate tunnel oxide transistor requires a program signal that is from approximately +15V to approximately +20V and the voltage level of the source line is set to the ground reference voltage level to set the threshold voltage of the first floating gate tunnel oxide transistor or the second floating gate tunnel oxide transistor to a voltage level (+2.0V) above a read voltage level for programming. The source line of the first floating gate tunnel oxide transistor and the second floating gate tunnel oxide transistor requires an erase signal that is from approximately +15V to approximately +20V and the voltage level of the control gate is set to the ground reference voltage level to set the threshold voltage of the first floating gate tunnel oxide transistor or the second floating gate tunnel oxide transistor to a voltage level (−2.0V) below a read voltage level.

The nonvolatile static random access memory array has a power detection circuit in communication with the plurality of integrated nonvolatile static random access memory circuits to detect a power interruption and a power initiation of the nonvolatile static random access memory array. The detection of the power interruption and detection of the power initiation to the array of integrated nonvolatile static random access memory circuits.

The first data terminal is connected to a storage node between the first access transistor and the latched memory element to transfer the digital signal to the first floating gate tunnel oxide EEPROM element. The second data terminal is connected to a complementary storage node between the second access transistor and the latched memory element to transfer the digital signal to the second floating gate tunnel oxide EEPROM element.

The drain of the first floating gate tunnel oxide transistor is connected to the source of the first gating transistor such that when the first select gating signal is activated the drain of the first floating gate tunnel oxide transistor is connected to the first data terminal of the latched memory element. The drain of the second floating gate tunnel oxide transistor is connected to the source of the first gating transistor of the second floating gate tunnel oxide EEPROM element such that when the first select gating signal is activated the drain of the second floating gate tunnel oxide transistor is connected to the second data terminal of the latched memory element.

The control gates of the first and second floating gate tunnel oxide transistors receive read, program, and erase signals from a word line for each row of the array of integrated nonvolatile static random access memory circuits. The source lines of each row of integrated nonvolatile static random access memory circuits are connected to receive a source line signal for reading, programming, and erasing the first floating gate tunnel oxide transistor.

When the power detection circuit detects the power initiation of the integrated nonvolatile static random access memory circuit, the digital signal retained in the first floating gate tunnel oxide transistor is restored to the static random access memory cell by reading the first and second floating gate tunnel oxide EEPROM elements. The first and second floating gate tunnel oxide EEPROM elements are read by setting the source line to a voltage level of a power supply voltage source. The first and second select gating signals are set to a very large positive voltage level of between approximately +15 and +20V to activate the first and second select gating transistors. The EEPROM word line is set to a read voltage level to activate the first and second floating gate tunnel oxide transistor if it is programmed with the data signal at a first data level and to remain inactive if the first floating gate tunnel oxide transistor is programmed with the data signal at a second data level. If the first floating gate tunnel oxide transistor is activated and the second floating gate tunnel oxide transistor is deactivated, the first data level is transferred to the first data terminal of the static random access memory cell and the second data level is transferred to the second data terminal of the static random access memory cell. If the first floating gate tunnel oxide transistor is not activated and the second floating gate tunnel oxide transistor is activated, the second data level is transferred to first data terminal to the static random access memory cell and the first data level is transferred to the second data terminal of the static random access memory cell. The SRAM word line is set to a voltage level that will not turn on the first and second access transistors to prevent the static random access memory cell from being connected to the bit line and the complementary bit line.

Subsequent to restoring the digital signal to the static random access memory cell, the first and second floating gate tunnel oxide EEPROM elements are erased. The first and second floating gate tunnel oxide EEPROM elements are erased by setting the first select gating signal to a voltage level that will turn off the first select gating transistor to isolate the static random access memory cell from the first floating gate tunnel oxide EEPROM element. The EEPROM word line is set to a ground reference voltage level. The second select gating signal and the source line signal is set to the very large positive voltage level of between approximately +15 and +20V such that charge is extracted from the floating gate of the first and second floating gate tunnel oxide transistors.

Subsequent to the erasing the first and second floating gate tunnel oxide EEPROM elements, the first and second floating gate tunnel oxide EEPROM element are isolated from the static random access memory cell and the static random access memory cell is operated in a normal mode. In the normal mode, the static random access memory cell retains the digital signal as volatile digital data by setting the first select gating signal such that the first select gating transistors of the first and second floating gate tunnel oxide EEPROM element is deactivated and the static random access memory cell is isolated from the first floating gate tunnel oxide EEPROM elements.

When the power detection circuit detects a power interruption of the integrated nonvolatile static random access memory circuit, the digital signal retained in the static random access memory cell is programmed to the first floating gate tunnel oxide transistor. The first floating gate tunnel oxide EEPROM element is programmed by setting the first select gating signal to the very high positive voltage level of between approximately +15 and +20V to activate the first select gating transistor. The second select gating signal is set to turn off the first select gating transistor. The EEPROM word line is set to the very high positive voltage level such that if the data signal at the first data terminal is the first data level, charge is placed on the floating gate and if the data signal at the first data terminal is the second data level, charge is inhibited from entering the floating gate and the first floating gate tunnel oxide transistor remains erased.

BRIEF DESCRIPTION OF THE DRAWINGS

FIGS. 1a and 1b are schematic diagrams of an SRAM of the prior art

FIG. 2a is a schematic diagram of an EEPROM nonvolatile memory element of the prior art.

FIGS. 2b and 2c are cross sectional diagrams of an EEPROM nonvolatile memory element of the prior art.

FIG. 7 is a table illustrating the operational voltages of a nonvolatile static random access memory circuit of this invention.

DETAILED DESCRIPTION OF THE INVENTION

The integrated nonvolatile static random access memory (NVSRAM) circuit of this invention integrates an SRAM cell with floating gate tunnel oxide EEPROM elements. The NVSRAM circuit of this invention operates as a conventional SRAM, allowing for high-speed random read and write operations when VDD is turned on, but also as a floating gate tunnel oxide EEPROM cell that is capable of retaining the SRAM data upon interruption of the power supply voltage source VDD. The digital data is retained permanently within the NVSRAM circuit because the digital data is written into the floating gate tunnel oxide EEPROM elements. A power supply detection circuit provides the appropriate control signals to write the digital data retained within the SRAM cell to the nonvolatile memory elements within a predetermined period time upon detection of an interruption in the power supply voltage source VDD. The power supply detection circuit, upon detection of an initiation of the power supply voltage source, reads the last stored digital data stored in the nonvolatile memory elements and writes the digital data to the SRAM memory cell.

Figure 3B:
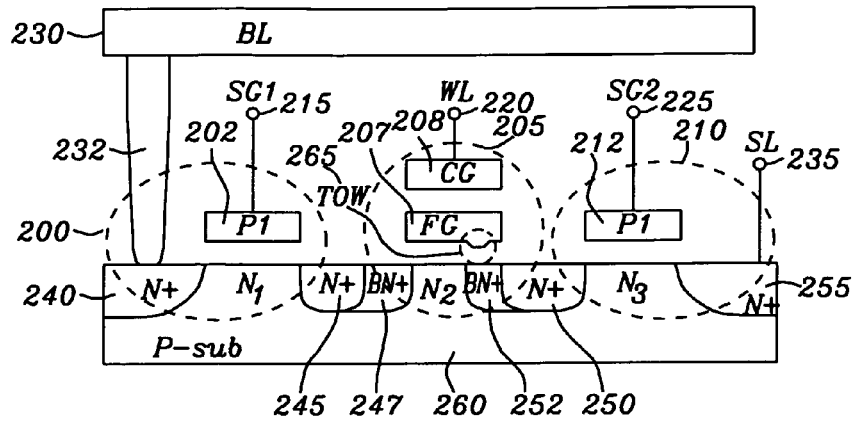
FIGS. 3b and 3c are a cross sectional diagram of an EEPROM nonvolatile memory element of this invention.
Figure 3A:
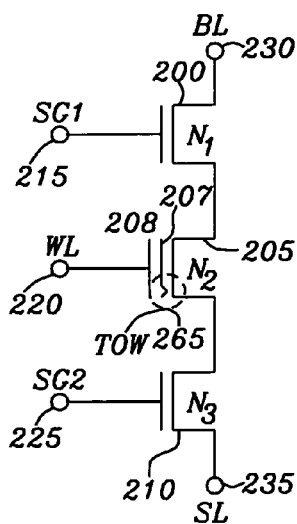
FIG. 3a is a schematic diagram of an EEPROM nonvolatile memory element of this invention.

FIG. 3a is schematic diagram of for a three-transistor, CMOS floating gate tunnel oxide (FLOTOX) EEPROM cell of this invention. The three-transistor, CMOS floating gate tunnel oxide EEPROM cell is similar to the two-transistor FLOTOX EEPROM as shown in FIG. 2a with the addition of a third NMOS device N3. The FLOTOX EEPROM cell of this invention includes of three transistors 200, 205, and 210. The first select transistor, $N_1$ 200 is a Polysilicon. NMOS device with its gate connected to a first select gate signal SG1 215. The source of the first select transistor, $N_1$ 200 is connected to the drain of the floating gate tunnel oxide (FLOTOX) EEPROM cell $N_2$ 205. The FLOTOX EEPROM cell $N_2$ 205 is a double polysilicon floating gate device. A first layer of polysilicon is the floating-gate 207 that is used to store the charge levels representing the binary "0" and binary "1" of the stored data. The second layer of the polysilicon is a control gate 208 that is connected to the word line WL 215. The drain of the select transistor $N_1$ 200 is connected to a vertical and global metal bit line BL 220. The source of the EEPROM cell $N_2$ 205 is connected to the drain of the second select transistor $N_3$ 210. The source of the second select transistor $N_3$ 210 is connected to a common source line SL 225. The gate of the second select transistor $N_3$ 210 is connected to the second select gate signal SG2 225.

Figure 3C:
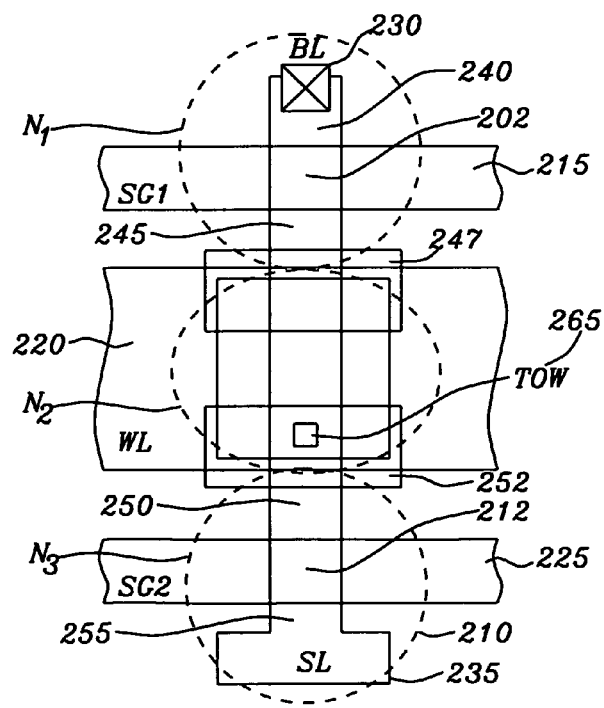

FIGS. 3b and 3c illustrate the physical layout for the three-transistor FLOTOX EEPROM circuit of FIG. 3a of the three-transistor FLOTOX EEPROM cell as formed in a substrate 260. A first layer polysilicon conductor forms the first select gate 202 and second select gate 212 of the select gate transistors $N_1$ 200 and $N_2$ 210. The first select gate 202 is connected to the first select gating line SG1 215 and the second select gate 212 is connected to the second select gating line SG2 225. The first select gating line SG1 215 and the second select gating line SG2 225 run horizontally in parallel with a second level polysilicon conductor that forms the word line WL 220. The overlapping area of the first select gate 202 and $N^+$ active layers 240 and 245 form the polysilicon NMOS first select transistor $N_1$ 200. The drain region 240 of the first select transistor 205 has a half-contact 232 for the connection with the global metal bit line BL 220. The FLOTOX EEPROM cell $N_2$ 205 is a double-poly floating gate transistor and is formed above the $N^+$ layers 245 and 250. The buried active layer BN+ 247 extends from the drain region 245 under the floating gate 207. The first layer polysilicon conductor forming the floating gate 207 and is placed below the second layer polysilicon conductor that forms the control gate 208. A square box of a tunnel oxide window layer TOW 265 has about 200 Å thickness to allow Fowler-Nordheim programming and erasing during the normal write operation of the FLOTOX EEPROM cell $N_2$ 205. The tunnel oxide window layer TOW 265 is placed above the buried active layer BN+ 252 to provide a conductive path for Fowler-Nordheim charge tunneling during programming and erasing the FLOTOX EEPROM transistor $N_2$ 205

The second select transistor $N_3$ 210 is similar to the first select transistor, $N_1$ 200 with the same device's width and channel length. The source node 255 of second select transistor $N_3$ 210 is connected to the common node of the source line SL 235. The sources 255 of all the second select transistors $N_3$ 210 are connected together via an $N^+$ active layer that forms the source line SL 235 for each row of an array block of an NVSRAM array. The common bulk of the first select transistor, $N_1$ 200, FLOTOX EEPROM cell $N_2$ 205 and second select transistor $N_3$ 210 devices is within the P-type substrate 260 which is usually held at the ground reference voltage level.

The tunnel window TOW 265 of FLOTOX EEPROM cell $N_2$ 205 of FIG. 1B has been rotated 180 degree in EEPROM cell $N_2$ 205 of FIGS. 2b and 2c from the EEPROM cell $N_2$ 105 of FIGS. 1b and 1c. Further, the cell size of floating gate tunnel oxide EEPROM element has been increased from two-transistor to three-transistor. The reason to increase the cell size and the rotation of 180 degree of EEPROM cell $N_2$ 205 for the new three-transistor floating gate tunnel oxide EEPROM element of the present invention is explained hereinafter.

Table 1 illustrates the operation voltages for the three-transistor, CMOS floating gate tunnel oxide (FLOTOX) EEPROM cell of this invention as compared with the two-transistor FLOTOX EEPROM cell of the prior art. It should be noted that in each case the programming and erasing is accomplished by Fowler-Nordheim tunneling.

TABLE 1

|  | Two Transistor EEPROM of the Prior Art | Three Transistor NVSRAM EEPROM of this invention |
| --- | --- | --- |
| Erased $V_t$ | +2 V | −2 V |
| Programmed $V_t$ | −2 V | +2 V |
| Erase conditions | Vg == +15 V−+20 V, Vd = Vs = 0 V | Vg = 0 V, Vd = Vs = +15 V−+20 V |
| Program conditions | Vg = 0 V, Vd = Vs = +15 V−+20 V | Vg = +15 V−+20 V, Vd = Vs = 0 V |
| Program inhibit conditions | Vg = 0 V, Vd = Vs = 0 V | Vg = +15 V−+20 V, Vd = Vs = 0.8 × Vg |
| Erase scheme | FN channel | FN channel |
| Program scheme | FN channel | FN channel |

The erased threshold voltage ($V_t$) for the two-transistor FLOTOX EEPROM cell of the prior art is approximately +2.0V where the erased threshold voltage ($V_t$) for the three-transistor, CMOS floating gate tunnel oxide (FLOTOX) EEPROM cell of this invention is approximately −2.0V. The programmed threshold voltage ($V_t$) for the two-transistor FLOTOX EEPROM cell of the prior art is approximately −2.0V where the programmed threshold voltage ($V_t$) for the three-transistor, CMOS floating gate tunnel oxide (FLOTOX) EEPROM cell of this invention is approximately +2.0V.

To meet the erased threshold values, the two-transistor FLOTOX EEPROM cell of the prior art has the control gate voltage Vg set to a voltage level of from approximately +15.0V−+20V and the drain and source of the CMOS floating gate tunnel oxide (FLOTOX) EEPROM cell set to the ground reference voltage level (0V). To meet the erased threshold values, the three-transistor FLOTOX EEPROM cell of this invention has the control gate voltage Vg set to the ground reference voltage level (0V) and the drain and/or source of the CMOS floating gate tunnel oxide (FLOTOX) EEPROM cell set to a voltage level of from approximately +15V−+20V. To meet the programmed threshold values, the two-transistor FLOTOX EEPROM cell of the prior art has the control gate voltage Vg set to the ground reference voltage level (0V) and the drain and source of the CMOS floating gate tunnel oxide (FLOTOX) EEPROM cell set to a voltage level of from approximately +15V−+20V. To meet the programmed threshold values, the three-transistor FLOTOX EEPROM cell of this invention has the control gate voltage Vg is set to a voltage level of from approximately +15V−+20V and the drain and/or source of the CMOS floating gate tunnel oxide (FLOTOX) EEPROM cell is set to the ground reference voltage level (0V).

To inhibit programming of the a cell for the two-transistor FLOTOX EEPROM cell of the prior art, the control gate voltage Vg and the drain and source of the CMOS floating gate tunnel oxide (FLOTOX) EEPROM cell are set to the ground reference voltage level (0V). To inhibit programming of a cell for the three-transistor, CMOS floating gate tunnel oxide (FLOTOX) EEPROM cell of this invention, the control gate voltage Vg is set to a voltage level of from approximately +15V−+20V and the drain and/or source of the CMOS floating gate tunnel oxide (FLOTOX) EEPROM cell coupled to assume a channel inhibit voltage level that is the value of the coupling ratio (80%) of the control gate voltage level Vg or of from approximately 12V to approximately 16V. The channel inhibit voltage level is the result of the EEPROM channel region being forced to a voltage that is equal to the effective coupling ratio of the EEPROM cell multiplied by the control gate voltage Vg. The effective coupling ratio of the EEPROM cell depends on the EEPROM cell structure and is typically larger than 80%.

Figure 4:
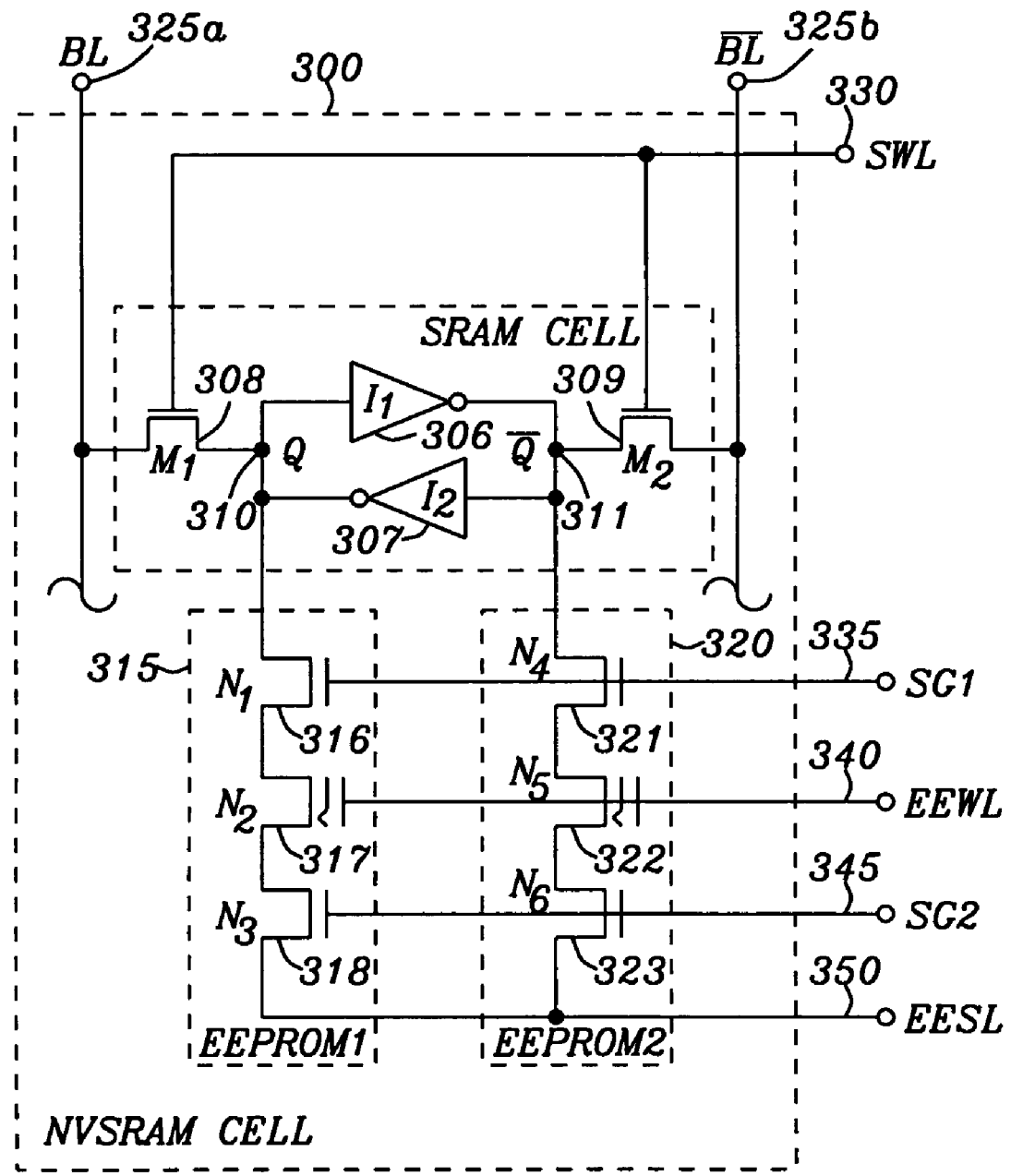
FIG. 4 is a schematic diagram of a first embodiment of nonvolatile static random access memory circuit of this invention.

FIG. 4 is a schematic diagram of a first embodiment of an integrated nonvolatile SRAM circuit. Refer now to FIG. 4 for a discussion of the first embodiment of the integrated nonvolatile SRAM circuit 300. The integrated nonvolatile SRAM circuit 300 has an SRAM cell 305 and two floating gate tunnel oxide EEPROM elements 315 and 320 The SRAM cell is similar to the traditional SRAM cell described in FIGS. 1a and 1b. The inverters $I_1$ 306 and $I_2$ 307 are coupled such that the output of the inverter $I_1$ 306 is connected to the input of the inverter $I_2$ 307 and the output of the inverters $I_2$ 307 is connected to the input of the inverter $I_1$ 306 to form the bistable latch. The access transistor $M_1$ 308 has a drain terminal connected to the input of the inverter $I_1$ 306 and the output of the inverter $I_2$ 307 and a source terminal connected to the bit line BL 325a. The access transistor $M_2$ 309 has a drain terminal connected to the input of the inverter $I_2$ 307 and the output of the inverter $I_1$ 306 and a source terminal connected to the bit line $\overline{BL}$ 325b. The gates of the access transistors $M_1$ 308 and $M_2$ 309 are connected to the SRAM word line SWL 330 to receive the activation signals for accessing the memory cell.

The two floating gate tunnel oxide EEPROM elements 315 and 320 are identical those described above in FIGS. 3a-3c. The control gates of the two floating gate tunnel oxide transistors 317 and 322 are connected to the EEPROM word line EEWL 340. The gates of the first select transistors 316 and 317 are connected to the first select gating signal SG1 335. The gates of the second select transistors 318 and 323 are connected to the second select gating signal SG2 345. The source line EESL 350 is shared by the sources of the select transistors 318 and 323. The common bulk of the transistors of the two floating gate tunnel oxide EEPROM elements 315 and 320 $N_1$ 316, $N_2$ 317, $N_3$ 318, $N_4$ 321, $N_5$ 322 and $N_6$ 323 are all tied to the P-type substrate, as described above.

The node capacitance of storage node Q 310 and complementary storage node $\overline{Q}$ 311 of the output nodes of inverters $I_1$ 306 and $I_2$ 307 of the SRAM 305 are made identical to ensure the fully symmetrical circuit for high-noise immunity of the SRAM cell 305 in read and write operations. During read and write operations of the SRAM cell 305, the gate of the first select gating signal 335 is set to ground reference voltage level to shut off the two first select transistors 316 and 317 so that SRAM cell of this NVRAM is completely isolated from the remaining part of EEPROM electrically. The SRAM cell 305 is connected to the two floating gate tunnel oxide EEPROM elements 315 and 320 when the both first select transistors 316 and 321 are turned on by connecting the first select gating signal SG1 335 to a voltage level of the power supply voltage source VDD or a higher voltage level. This occurs only when SRAM data is either being written into two floating gate tunnel oxide EEPROM elements 315 and 320 during interruption of the power supply voltage source VDD in a power-down period or the SRAM cell 305 is being restored or loaded with the data in the floating gate tunnel oxide transistors $N_1$ 316 and $N_5$ 322 of the two floating gate tunnel oxide EEPROM elements 315 and 320 being read to the SRAM during the initiation of the power supply voltage source during a power-up period.

The two floating gate tunnel oxide EEPROM elements 315 and 320 of the present invention are implemented using the current popular and mature process of traditional FLOTOX EEPROM manufacture. Using the current process, the two floating gate tunnel oxide EEPROM elements 315 and 320 employ a Fowler-Nordheim tunneling for the program and erase operation. To perform the programming and erasing a positive high-voltage of from approximately +15V to approximately +20V is applied to the selected EEPROM word line EEWL 340 for programming and to the source line EESL 350 for erasing. The two floating gate tunnel oxide EEPROM elements 315 and 320 of this embodiment requires that a nonvolatile static random access memory array an on-chip, low-current, positive high-voltage charge pump. There is no need for any other negative high-voltage charge pump. This provides a much simplified circuit design for program and erase of the floating gate tunnel oxide transistors $N_1$ 316 and $N_5$ 322 during the power initiation and power interruption of the power-up and power-down cycles.

Figure 5:
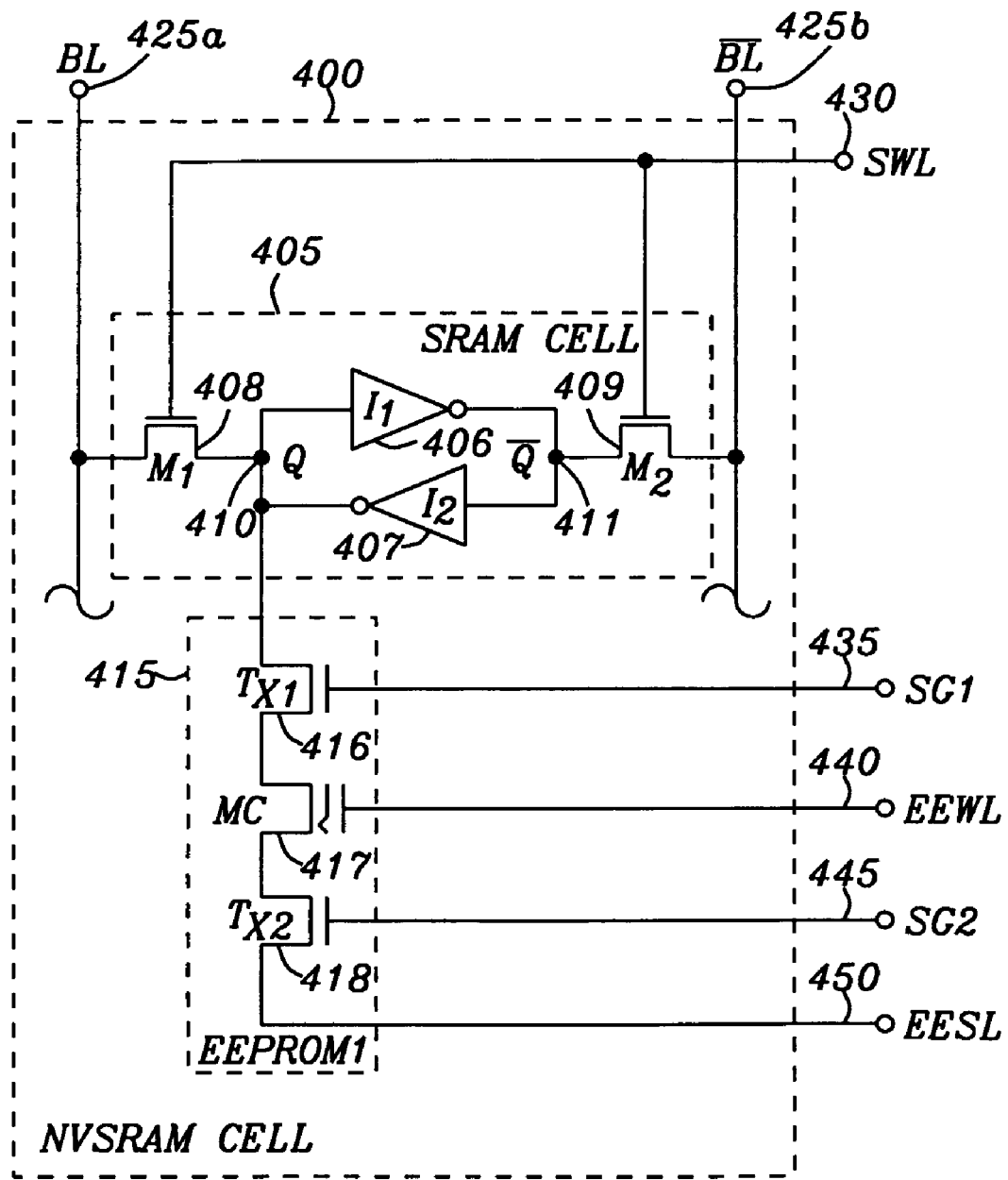
FIG. 5 is a schematic diagram of a second embodiment of nonvolatile static random access memory circuit of this invention.

FIG. 5 is a schematic diagram of a second embodiment of nonvolatile static random access memory circuit of this invention. Referring to FIG. 5. The basic structure is similar to that of FIG. 4 where the integrated nonvolatile SRAM circuit 300 includes an SRAM cell 405. The SRAM cell 405 is identical to that of FIG. 4 where inverters $I_1$ 406 and $I_2$ 407 are coupled such that the output of the inverter $I_1$ 406 is connected to the input of the inverter $I_2$ 407 and the output of the inverters $I_2$ 407 is connected to the input of the inverter $I_1$ 406 to form the bistable latch. The access transistor $M_1$ 408 has a drain terminal connected to the input of the inverter $I_1$ 406 and the output of the inverter $I_2$ 407 and a source terminal connected to the bit line BL 425a. The access transistor $M_2$ 409 has a drain terminal connected to the input of the inverter $I_2$ 407 and the output of the inverter $I_1$ 406 and a source terminal connected to the bit line $\overline{BL}$ 425b. The gates of the access transistors $M_1$ 408 and $M_2$ 409 are connected to the SRAM word line SWL 440 to receive the activation signals for accessing the memory cell.

In the second embodiment there is one floating gate tunnel oxide EEPROM element 415 for permanently retaining the digital data. The floating gate tunnel oxide EEPROM element 315 is identical those described above in FIGS. 3a-3c. The control gate of the floating gate tunnel oxide transistor 417 is connected to the EEPROM word line 440. The gate of the first select transistor 416 is connected to the first select gating signal SG1 435. The gate of the second select transistor 418 is connected to the second select gating signal SG2 445. The source line EESL 450 is connected to the source of the select transistors 418. The common bulk of the transistors of the floating gate tunnel oxide EEPROM element 415 $N_1$ 416, $N_2$ 417, and $N_3$ 418 are all tied to the P-type substrate, as described above.

The floating gate tunnel oxide EEPROM element 415 functions with the same voltage levels as described for the programming and erasing of the first The floating gate tunnel oxide EEPROM element 315 as described in FIG. 4. The floating gate tunnel oxide EEPROM element 415 being connected to the single storage node Q 310 causes the node capacitance of storage node Q 310 and complementary storage node $\overline{Q}$ 311 of the output nodes of inverters $I_1$ 306 and $I_2$ 307 of the SRAM 305 to be imbalanced. This imbalance must be compensated to insure high-noise immunity of the SRAM cell 305 in read and write operations.

Figure 6:
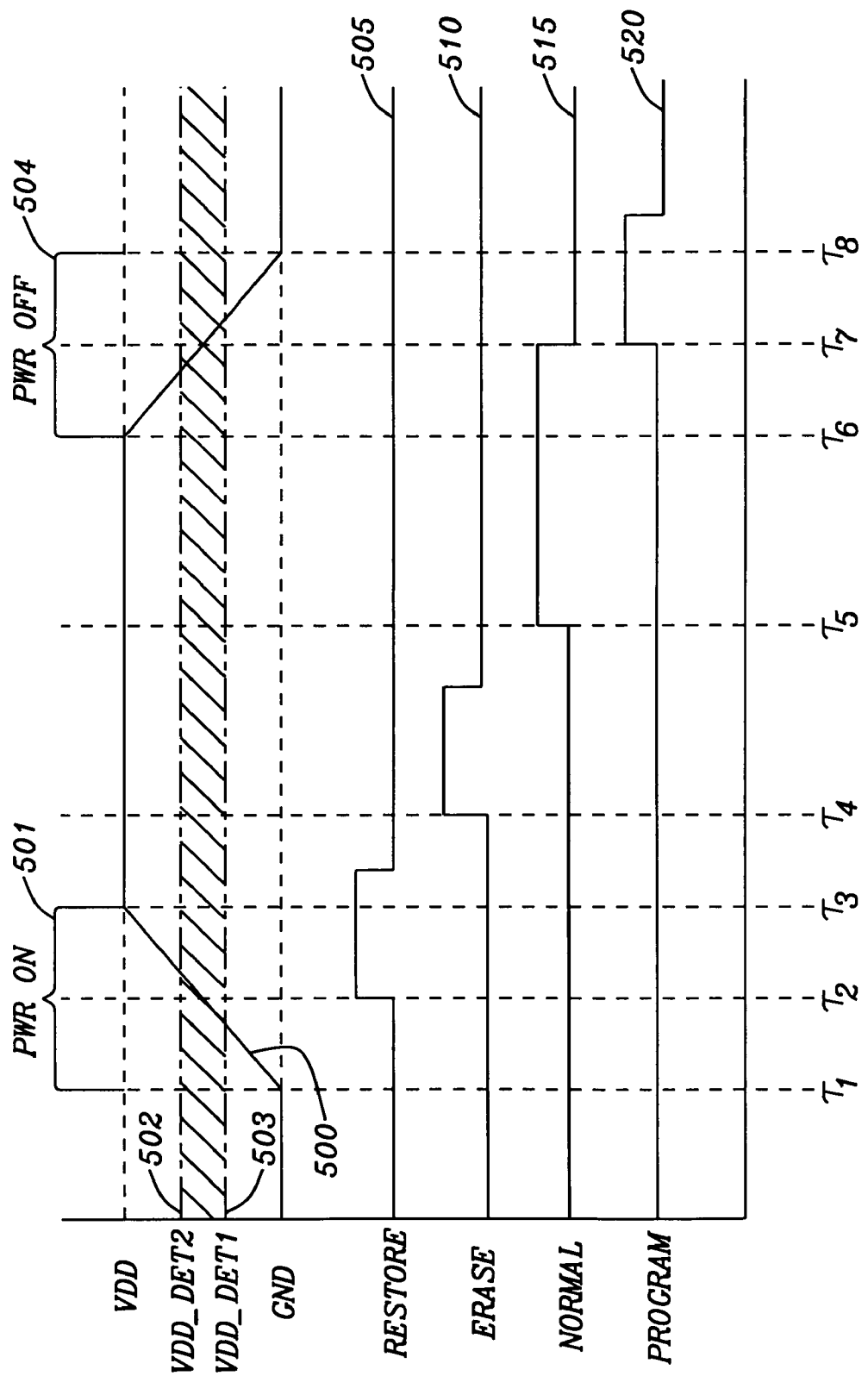
FIG. 6 is a timing diagram illustrating the operational timings of a nonvolatile static random access memory circuit of this invention.

FIG. 6 is a timing diagram illustrating the operational timings of a nonvolatile static random access memory circuit of this invention. A nonvolatile static random access memory array includes a power detection circuit to determine if the power supply voltage VDD has been initiated or interrupted. The first waveform 500 illustrates the initiation of the power supply voltage source VDD. During a power on time 501 between the times $\tau_1$ and $\tau_3$ the power supply voltage source transits from a voltage level of ground reference voltage level to that of the active voltage level of the circuits. The power supply voltage level VDD may be 5V, 3V or 1.8V depending on the technology and system operating voltage requirements. As the voltage level transits from the voltage level of the ground reference voltage (0V), the power detection circuit senses the change in voltage and when it reaches a power on voltage detection level, the power detection circuit issues a power initiation signal. The power on voltage detection level being the level at which the restoration of the stored data signal present as charge on the floating gate tunnel oxide EEPROM element into its corresponding bit of SRAM cell of the nonvolatile static random access memory array. The voltage detection level is established as being in the range of voltages between the first detection voltage level VDD_DET1 502 and second detection voltage level VDD_DET2 503

Similarly, whenever there is a power interruption, the active voltage level of the power supply voltage source begins to transit from the power supply voltage level (VDD) to that of the ground reference voltage level during the power off time 504 between the times $\tau_1$ and $\tau_3$. As the voltage level transits from the voltage level of the active voltage level of the power supply voltage source (VDD), the power detection circuit senses the change in voltage and when it reaches a power off voltage detection level, the power detection circuit issues a power termination signal. The power off voltage detection level being the level at which each bit of the stored data signal present within SRAM cells is programmed to the floating gate tunnel oxide EEPROM elements 415. The power off voltage detection level is established as being in the range of voltages between the first detection voltage level VDD_DET1 502 and second detection voltage level VDD_DET2 503. The power on voltage detection level is preferably less than the power off voltage detection level, however the two voltage detection levels may be equal or the power on detection level may be greater than the power on voltage detection level and still be in keeping with this intent of this invention.

When the power initiation signal is detected, a restore command 505 issued at the time $\tau_2$, each bit of the stored data signal present as charge on the floating gate tunnel oxide EEPROM element is down loaded or transferred into its corresponding bit of SRAM cell of the nonvolatile static random access memory array of the present invention.

Referring to the Table of FIG. 7, during the restore operation, the SRAM word line (SWL) is set to the ground reference voltage level (0) to disconnect the SRAM cell from the bit lines BL and $\overline{BL}$. The bit lines BL and $\overline{BL}$ are set to any state and are consequently in a "don't care" condition. The first and second select gating signals (SG1 and SG2) are set to a very high voltage (VPP) of from approximately +15V to approximately +20V to respectively activate the first and second select transistors. The EEPROM word line (EEWL) is set to the read voltage level (VREAD). The read voltage level VREAD is a voltage level that is between the voltage level representing a binary "0" and the voltage level representing a binary "1". The source line (EESL) for the floating gate tunnel oxide EEPROM elements is set to the voltage level of the power supply voltage source. If the data in the floating gate tunnel oxide EEPROM element is a binary "1" (low threshold for the floating gate tunnel oxide transistors) the floating gate tunnel oxide transistors turns on and the storage node Q or complementary storage node $\overline{Q}$ is set to the voltage level of the binary "1". Alternately, if the data in the floating gate tunnel oxide EEPROM element is a binary "0" (high threshold for the floating gate tunnel oxide transistors) the floating gate tunnel oxide transistors remains turned off and the storage node Q or complementary storage node $\overline{Q}$ is set to the voltage level of the binary "0".

After the power on time 502 is completed and the restoration of the stored data signal is down loaded from the floating gate tunnel oxide EEPROM element to its corresponding bit of SRAM cell of the nonvolatile static random access memory array, an erase command 510 is issued at the time $\tau_4$ and all the floating gate tunnel oxide EEPROM elements are erased. The erase cycle 510 removes the charge from the floating gate tunnel oxide EEPROM elements and establishes a data signal representing a binary "1" on each of the floating gate tunnel oxide EEPROM elements. All the floating gate tunnel oxide EEPROM elements are set such that the data signal is a binary "1". The erase is because the digital signals within floating gate tunnel oxide EEPROM elements have been written successfully into all SRAM cells in restore cycle 505 and there is no need to retain any of the old stored data. There is however an immediate need to prepare all floating gate tunnel oxide EEPROM elements for receiving the new data signals stored in SRAM cells immediately upon a sudden power interruption 540. The floating gate tunnel oxide EEPROM element must be prepared for receiving any new data quickly and to reduce the time for the writing steps (an erase then program sequence). The write cycle is then just the program cycle 520. After erase command 510 is executed, all floating gate tunnel oxide EEPROM elements all have charge representing data signals for a binary "1".

Referring back to FIG. 7, the erase of all the floating gate tunnel oxide EEPROM elements is accomplished by setting the SRAM word line (SWL) and the first select gate (SG1) are set to the ground reference voltage level (0) to completely isolate floating gate tunnel oxide EEPROM elements from SRAM cells. The EEPROM word line (EEWL) is set to the ground reference voltage level (0V). The second select gating signal (SG2) and the source line (EESL) are set to the very high voltage (VPP) of from approximately +15V to approximately +20V. The charge on the floating gate of the floating gate tunnel oxide transistors is removed and the floating gate tunnel oxide transistors are set to a binary "1" through a Fowler-Nordheim tunneling.

After the completion of the erase cycle 510, the normal command 515 is issued at the time $\tau_5$. The SRAM cells function normally as volatile SRAM cells of the prior art. All floating gate tunnel oxide EEPROM elements are transparent to and the SRAM cells employ normal techniques to read and write as those used the traditional SRAM cells of the prior art. In this Normal SRAM cycle 515, the read and write operation for SRAM cells are executed for unlimited cycles as with the traditional SRAM cells of the prior art. There are no concerns of program/endurance limitations or data retention issues as found is non integrated SRAM cells and Nonvolatile EEPROM cells.

Referring again to FIG. 7, during the normal operation of the SRAM cell, the data and the complementary data are place respectively on the bit line BL and bit lines BL and $\overline{BL}$. The SRAM cell is selected by setting the gates of the access transistors to a voltage level of approximately the power supply voltage source (VDD). The storage node Q and complementary storage node $\overline{Q}$ receive the data signals during a write or transfer the data signals during a read to the bit lines BL and $\overline{BL}$. The floating gate tunnel oxide EEPROM element is isolated from the SRAM cell by setting the first and second select gates and the EEPROM word line to the ground reference voltage level (0). The EEPROM source line EESL is allowed to float or set to the ground voltage level.

The power off time 504 between the time $\tau_6$ and the time $\tau_8$ has the voltage level of the power supply voltage source decreasing from its active voltage level to the ground reference voltage level. When a power interruption is detected by the voltage level of the power supply voltage source becoming less than the power off voltage detection voltage level at the time $\tau_7$, the power termination signal generated by the power detection circuit is a program command 520. Each bit of the stored data signal present within SRAM cells is programmed to the floating gate tunnel oxide EEPROM elements 415 within a very short period of time approximately 200 μs. The program cycle initiated by the program command is defined to write all SRAM cells' volatile data signal into all floating gate tunnel oxide EEPROM elements of the nonvolatile static random access memory circuit. The writing from the SRAM cells to the floating gate tunnel oxide EEPROM elements is typically approximately 300 μs. The first select gate signal is coupled to the power supply voltage source VDD to turn on the select transistors to restore the connection between floating gate tunnel oxide EEPROM elements and SRAM cells.

Referring back to FIG. 7, during the program operation, the SRAM word line (SWL) is set to the ground reference voltage level (0) to isolate the SRAM cell from the bit lines BL and $\overline{BL}$. The bit lines BL and $\overline{BL}$ have a "don't care" condition. The first select signal (SG1) is set to the power voltage source (VDD) to turn on the select gating transistors. The data and the complementary data present at the storage node Q and complementary storage node $\overline{Q}$ as stored in the SRAM cell is now placed at the drain of the floating gate tunnel oxide transistors. The EEPROM word line is set to the very high voltage (VPP) of from approximately +15V to approximately +20V and the floating gate tunnel oxide transistors have charge placed on their floating gate if the data at the drain of the floating gate tunnel oxide transistors is a binary "0" and remain erased if the data at the drain is a binary "1". The floating gate tunnel oxide transistors are inhibited from programming by having the voltage level of the power supply voltage source (VDD) at the drain. The voltage present at the channel between the drain and source of the floating gate tunnel oxide transistor has a value that is equal to the coupling ratio (80%) multiplied by the control gate voltage level Vg or of from approximately 12V to approximately 16V. The channel inhibit voltage level is generated by AC high voltage coupling when the EEPROM word line is ramped from the voltage level of the ground reference voltage source (0V) to the level the very high voltage (VPP) of from approximately +15V to approximately +20V. When the coupled voltage present in the channel is at the channel inhibit voltage level, the voltage between the floating gate and the channel of the floating gate tunnel oxide transistor is insufficient for the Fowler-Nordheim tunneling. The second select signal (SG2) is set to the ground reference voltage level (0) to deactivate the second select gate transistor and EEPROM source line is allowed to float or is set to the ground reference voltage level (0).

Figure 8:
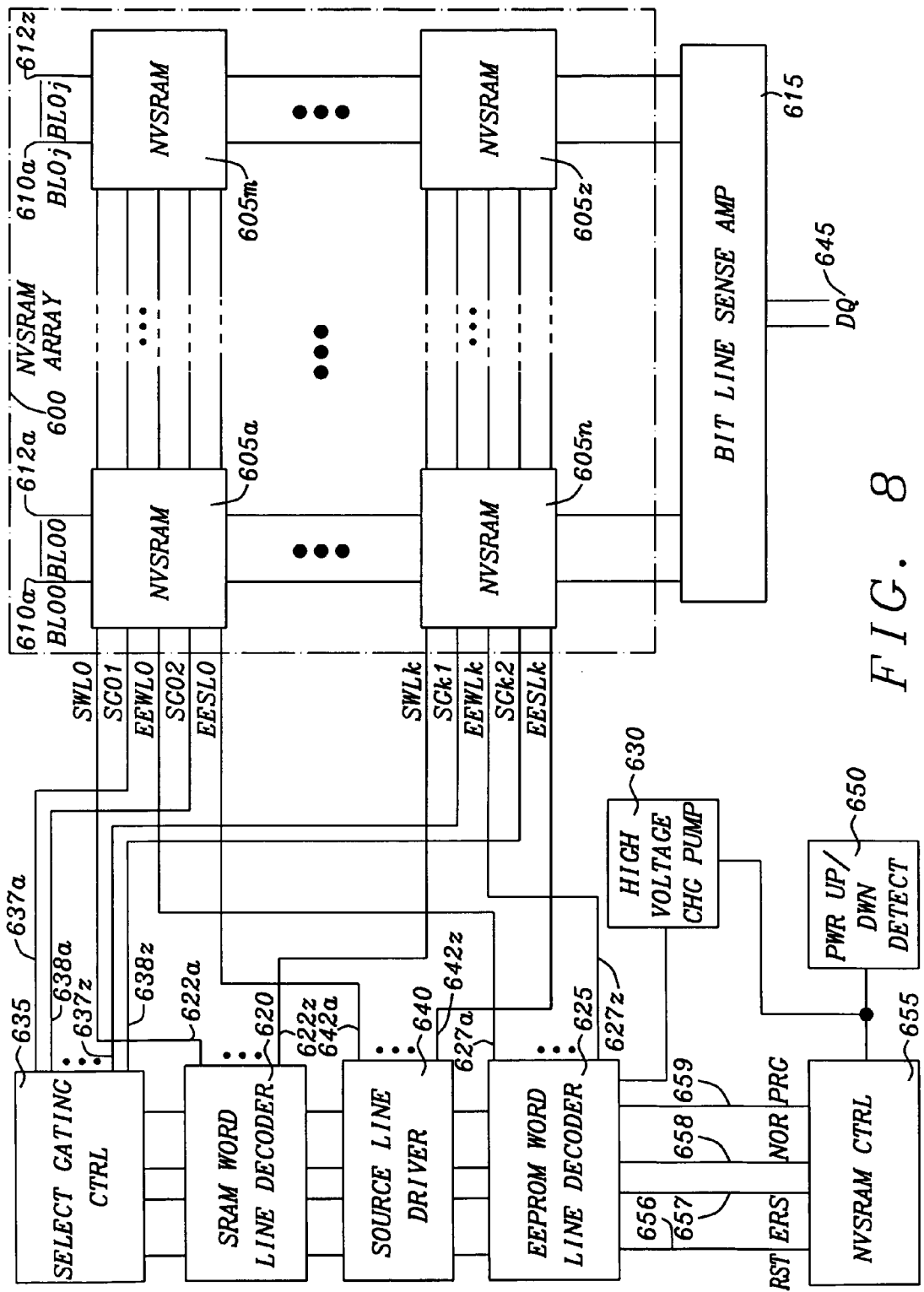
FIG. 8 is a block diagram of a nonvolatile static random access memory array of this invention.
Figure 9:
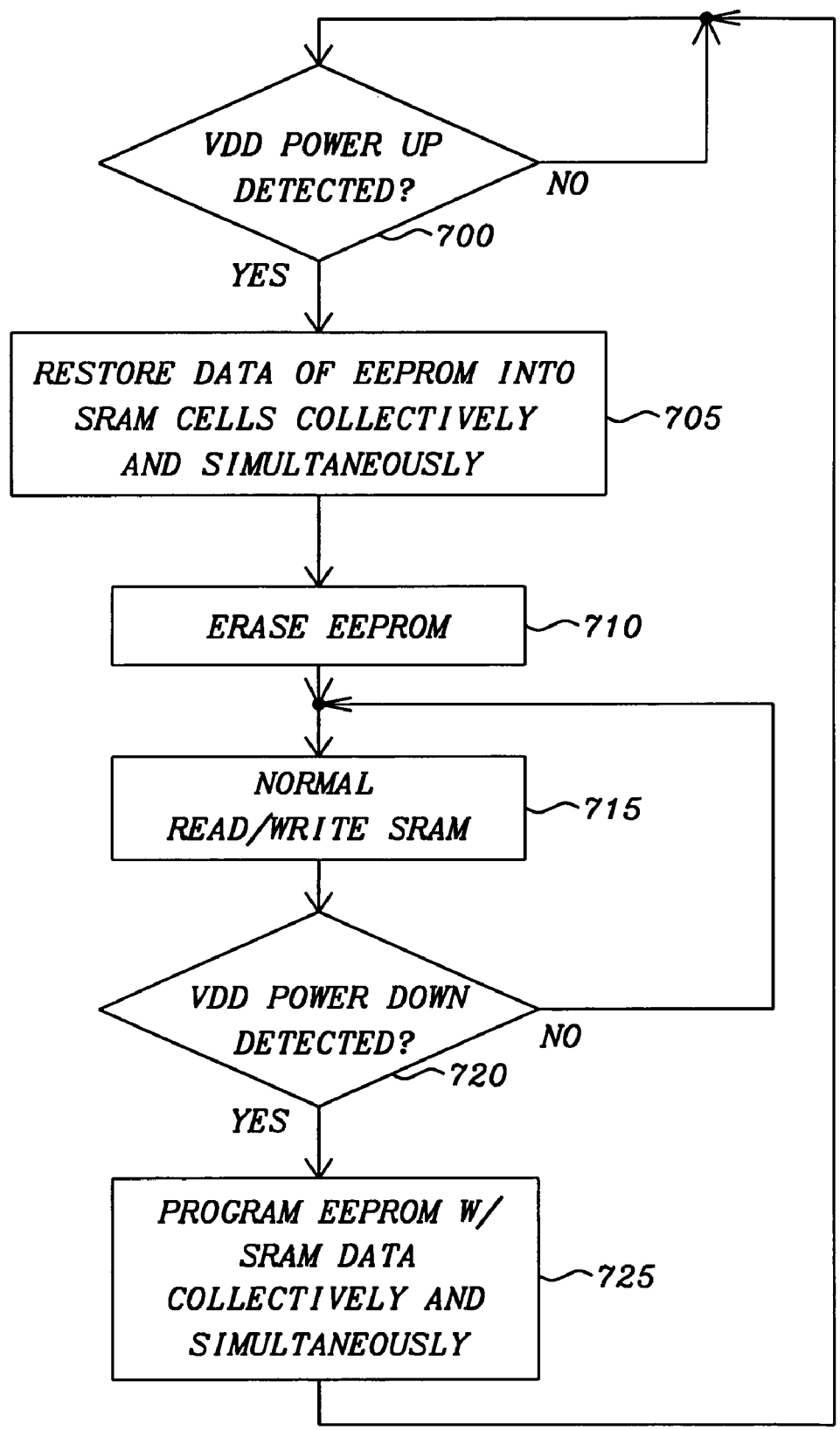
FIG. 9 is flow chart of the operation of the nonvolatile static random access memory circuit of this invention.

Multiple nonvolatile SRAM circuits of this invention as described in FIG. 4 or 5 are arranged to form a nonvolatile static random access memory array as shown in FIG. 8. FIG. 9 is flow chart of the operation of the nonvolatile static random access memory circuit of this invention. Refer now to FIGS. 8 and 9 for a discussion of the structure and operation of the array 600 of multiple nonvolatile SRAM circuits 605a, ..., 605m, 605n, ..., 605z.

The array 600 of multiple nonvolatile SRAM circuits 605a, ..., 605m, 605n, ..., 605z are arranged in rows and columns. Each column of the array of nonvolatile SRAM circuits 605a, ..., 605m, 605n, ..., 605z is connected to a bit line BL 610a, ..., 610z and the complementary bit line $\overline{BL}$ 612a, ..., 612z. The bit line BL 610a, ..., 610z and the complementary bit line $\overline{BL}$ 612a, ..., 612z are connected to the bit line sense amplifier 615 to provide the interconnections for writing and reading the digital signals representing the binary data to and from the SRAM cells of the nonvolatile SRAM circuits 605a, ..., 605m, 605n, ..., 605z. The digital signals representing the binary data are transferred from the input/output terminals DQ 645.

The SRAM word line decoder 620 receives an address (not shown) from an external source, decodes the address, and activates the SRAM word lines SWL0 622a, ... SWLk 622z to turn on the access transistors $M_1$ 308 and $M_2$ 309 to write or read the SRAM cells of the nonvolatile SRAM circuits 605a, ..., 605m, 605n, ..., 605z. The nonvolatile memory elements of the nonvolatile SRAM circuits 605a, ..., 605m, 605n, ..., 605z are deactivated as described above.

The select gating control circuit 635 is connected through the first and second gating signal lines SG01 637a, ..., SGk1 637z and SG02 638a, ..., SGk2 638z to the first and second select gating transistors of the nonvolatile memory elements of the nonvolatile SRAM circuits 605a, ..., 605m, 605n, ..., 605z to activate and deactivate the first and second select gating transistors. The source line driver circuit 640 is connected through the EEPROM source lines EESL0 642a, ..., EESLk 642z to the sources of the second select gating transistors of the nonvolatile memory elements of the nonvolatile SRAM circuits 605a, . . . , 605m, 605n, . . . , 605z to provide the source line voltage for floating gate tunnel oxide EEPROM element of the nonvolatile SRAM circuits 605a, . . . , 605m, 605n, . . . , 605z. The EEPROM word line decoder is connected through the floating gate word lines EEWL0 627a, . . . , EEWLk 627z for reading, programming, and erasing the floating gate transistors. The high voltage charge pump 630 provides the relatively large positive voltage of from approximately +15V to approximately +20V to the EEPROM word line decoder for distribution to floating gate tunnel oxide EEPROM element of the nonvolatile SRAM circuits 605a, . . . , 605m, 605n, . . . , 605z for programming and erasing the digital signals from the floating gate tunnel oxide transistors.

A power detection circuit 650 monitors (Box 700) the power supply voltage source VDD applied to the array 600 of nonvolatile SRAM circuits 605a, . . . , 605m, 605n, . . . , 605z for initiation. The power circuit 650 transfers a power supply state signal to the NVSRAM control circuit 655. Upon detection of an initiation of the power supply voltage source VDD, the restore operation is performed (Box 705) where the NVSRAM control circuit 655 activates the restore control line 656 and the data signals stored as charge in the floating gate tunnel oxide transistors are transferred as described above in the table of FIG. 7 to the SRAM Cells of the floating gate tunnel oxide EEPROM elements.

At the completion of the restore operation (Box 705), an erasure (Box 710) of the floating gate tunnel oxide transistors. The erase control line 657 is activated and all the floating gate tunnel oxide transistors of the floating gate tunnel oxide nonvolatile memory elements are erased as described above in the table of FIG. 7. After the erasure (Box 710) of the floating gate tunnel oxide transistors, the NVSRAM control circuit 655 then activates the normal operation control line 658 to command that the SRAM cells assume the normal operating mode (Box 715) as described above in the table of FIG. 7. The SRAM cells are isolated from the first gating signal lines SG01 637a, . . . , SGk1 637z are activated to isolate the SRAM cells from the floating gate tunnel oxide EEPROM elements of the nonvolatile SRAM circuits 605a, . . . , 605m, 605n, . . . , 605z.

During the normal operating mode (Box 715), the power detection circuit 650 monitors (Box 720) the power supply voltage source VDD applied to the array 600 of nonvolatile SRAM circuits 605a, . . . , 605m, 605n, . . . , 605z for an interruption. Upon detection of an interruption (a powering off or a power failure) of the power supply voltage source VDD, the data signals present in the SRAM cells are programmed (Box 725) to the floating gate of the floating gate tunnel oxide transistors. At the detection of the interruption, the NVSRAM control circuit 655 activates the program control line 659 and the data signals stored in the SRAM Cells are transferred as described above in the table of FIG. 7 as charge in the floating gate tunnel oxide transistors of the floating gate tunnel oxide EEPROM elements. When the power supply voltage source VDD is disabled, the power detection circuit 650 returns to monitoring (Box 700) for the initiation of the power supply voltage source VDD.

While this invention has been particularly shown and described with reference to the preferred embodiments thereof, it will be understood by those skilled in the art that various changes in form and details may be made without departing from the spirit and scope of the invention.

The invention claimed is:

1. An integrated nonvolatile static random access memory circuit formed on a substrate, the integrated nonvolatile static random access memory circuit comprising:
   a static random access memory cell connected to receive and retain a digital signal indicative of a data bit at a first bit line and a complementary digital signal indicative of a complementary data bit a second bit line and in communication with an SRAM word line for controlling access to the first and second bit lines; and
   a first EEPROM element in communication with the static random access memory cell to receive and permanently retain the digital signal from the static random access memory cell;
   wherein the first EEPROM element comprises:
      a first floating gate tunnel oxide transistor comprising an EEPROM control gate connected to an EEPROM word line for controlling activation of the first floating gate tunnel oxide transistor and a floating gate placed over a channel region between a drain and source of the first floating gate tunnel oxide transistor for permanently retaining the digital signal and placed over an insulating layer wherein the insulating layer has a first tunnel window placed in proximity to the source of the first floating gate tunnel oxide transistor for providing a path for transfer of charge between the floating gate and the source during erasing to set an erased threshold voltage level of the first floating gate tunnel oxide transistor and providing a path for transfer of charge between the floating gate and the channel for programming to set a programmed threshold voltage level of the first floating gate tunnel oxide transistor,
      a first select gating transistor having a drain connected to the static random access memory cell, a source connected to the drain of the floating gate tunnel oxide transistor, and a gate connected to a first select gating signal for controlling access between the floating gate tunnel oxide transistor and the static random access memory cell, and
      a second select gating transistor having a drain connected to the source of the floating gate tunnel oxide transistor, a source connected to a source line, and a control gate connected to a second select gating signal for controlling access between the floating gate tunnel oxide transistor and the source line.

2. The integrated nonvolatile static random access memory circuit of claim 1 further comprising:
   a second EEPROM element in communication with the static random access memory cell through the second data terminal to receive and permanently retain a complement of the digital signal from the static random access memory cell, wherein the second EEPROM element comprises:
      a second floating gate tunnel oxide transistor comprising a control gate connected to the EEPROM word line for controlling activation of the second floating gate tunnel oxide transistor and a floating gate placed over a channel region between a drain and source of the second floating gate tunnel transistor for permanently retaining the complement of the digital signal and placed over an insulating layer wherein the insulating layer has a second tunnel window placed in proximity to the source of the second floating gate transistor for providing a path for transfer of charge between the floating gate and the source during erasing to set an erased threshold voltage level of the second floating gate transistor and providing a path for transfer of charge between the floating gate and the channel for programming to set a programmed threshold voltage level of the first floating gate tunnel transistor, a third select gating transistor having a source connected to the drain of the second floating gate tunnel oxide transistor, a drain connected to the static random access memory cell, and a gate connected to a first select gating signal for controlling access to the second floating gate tunnel oxide transistor, and a fourth select gating transistor having a drain connected to the source of the second floating gate tunnel oxide transistor, a source connected to the source line, and a control gate connected to the second select gating signal for controlling access to the second floating gate tunnel oxide transistor from the source line.

3. The integrated nonvolatile static random access memory circuit of claim 2 wherein programming to a first data level increases the threshold voltage of the second floating gate tunnel oxide transistor to the programmed voltage level greater than a read voltage level by applying a program signal that is from approximately +15V to approximately +20V to the EEPROM word line and thus to the control gate of the first and the second floating gate tunnel oxide transistors to set the threshold voltage to the programmed voltage level that is greater than a read voltage level for programming and erasing to a second data level, the first and second floating gate tunnel oxide transistors decreases the threshold voltage of the second floating gate tunnel oxide transistor to the erased voltage level less than the read voltage level by applying an erase signal from approximately +15V to approximately +20V to the source line has to set the threshold voltage to the erased voltage level that is less than the read voltage level.

4. The integrated nonvolatile static random access memory circuit of claim 2 wherein:

the static random access memory cell comprises
    a latched memory element to retain the data bit at the first data terminal and the complementary data bit a second data terminal, and
    a first access transistor connected to allow control access of the bit line and a second access transistor connected to allow control access of a complementary bit line to the latched memory element for writing and reading the digital signal to and from the latched memory element, the first and second access transistors having control gates in communication with an SRAM word line for controlling access of the latched memory element to the first and second bit lines; and
wherein the first data terminal is connected to a storage node between the first access transistor and the latched memory element to transfer the digital signal to the first EEPROM element; and
the second data terminal is connected to a complementary storage node between the second access transistor and the latched memory element to transfer the digital signal to the second EEPROM element.

5. The integrated nonvolatile static random access memory circuit of claim 4 wherein:

the drain of the first floating gate tunnel oxide transistor is connected to the source of the first gating transistor of the first floating gate tunnel oxide EEPROM element such that when the first select gating signal is activated the drain of the first floating gate tunnel oxide transistor is connected to first data terminal of the latched memory element; and the source of the second floating gate tunnel oxide transistor is connected to the drain of the first gating transistor of the second floating gate tunnel oxide EEPROM element such that when the first select gating signal is activated the drain of the second floating gate tunnel oxide transistor is connected to the second data terminal of the latched memory element.

6. The integrated nonvolatile static random access memory circuit of claim 5 wherein the static random access memory cell retains the digital signal as volatile digital data by setting the first select gating signal such that the first select gating transistors of the first and second EEPROM elements are deactivated and the static random access memory cell is isolated from the first and second EEPROM elements.

7. The integrated nonvolatile static random access memory circuit of claim 4 wherein:
    a source line signal is applied to the source line for reading, programming, and erasing the first and second floating gate tunnel oxide transistors.

8. The integrated nonvolatile static random access memory circuit of claim 7 wherein at detection of a powering up of the integrated nonvolatile static random access memory circuit the digital signal the complement digital signal retained in the first and second floating gate tunnel oxide transistors are restored to the static random access memory cell by reading the first and second EEPROM elements.

9. The integrated nonvolatile static random access memory circuit of claim 8 wherein the first and second EEPROM elements are read by the steps of:
    setting the source line to a voltage level of a power supply voltage source;
    setting the first and second select gating signals to a very large positive voltage level to activate the first and second select gating transistors of the first and second EEPROM elements;
    setting the EEPROM word line to a read voltage level to activate the first or second floating gate tunnel oxide transistors if the first or second floating gate tunnel oxide transistor is programmed with the data signal at a first data level and to remain inactive if the first or second floating gate tunnel oxide transistor is programmed with the data signal at a second data level such that if the first floating gate tunnel oxide transistor is activated and the second floating gate tunnel oxide transistor is deactivated, the first data level is transferred to the static random access memory cell and if the first floating gate tunnel oxide transistor is not activated and the second floating gate tunnel oxide transistors is activated, the second data level is transferred to the static random access memory cell; and
    setting the SRAM word line to a voltage level that will not turn on the first and second access transistors to prevent the static random access memory cell from being connected to the bit line and the complementary bit line.

10. The integrated nonvolatile static random access memory circuit of claim 8 wherein subsequent to restoring the digital signal to the static random access memory cell, the first and second EEPROM elements are erased.

11. The integrated nonvolatile static random access memory circuit of claim 10 wherein first and second EEPROM elements are erased by the steps of:
    setting the first select gating signal to a voltage level that will turn off the first select gating transistor of each of the first and second EEPROM elements to isolate the static random access memory cell from the first and second EEPROM elements;
    setting the EEPROM word line to a ground reference voltage level; and setting the second select gating signal and the source line signal to the very large positive voltage level such that charge is extracted from the floating gates of the first and second floating gate tunnel oxide transistors.

12. The integrated nonvolatile static random access memory circuit of claim 10 wherein subsequent to the erasing the first and second EEPROM elements, the first and second EEPROM elements are isolated from the static random access memory cell and the static random access memory cell is operated in a normal mode.

13. The integrated nonvolatile static random access memory circuit of claim 12 wherein at detection of a powering down of the integrated nonvolatile static random access memory circuit, the digital signal and the complementary digital signal retained in the static random access memory cell are programmed to the first and second EEPROM elements.

14. The integrated nonvolatile static random access memory circuit of claim 13 wherein the first and second floating gate tunnel oxide EEPROM transistors are programmed by the steps of:

setting the first select gating signal to the very high positive voltage level to activate the first select gating transistor of each of the first and second EEPROM elements;

setting the second select gating signal to turn off the second select gating transistor of each of the first and second EEPROM elements; and setting the EEPROM word line to the very high positive voltage level such that if the data signal at the first data terminal is the first data level, charge is placed on the floating gate of the first floating gate tunnel oxide transistor and charge is inhibited from entering the floating gate of the second floating gate tunnel oxide transistor and if the first data terminal is at the second data level, charge is placed on the floating gate of the second floating gate tunnel oxide transistor and charge is inhibited from entering the floating gate of the first floating gate tunnel oxide transistor.

15. The integrated nonvolatile static random access memory circuit of claim 2 wherein:

the control gates of the first and second floating gate tunnel oxide transistors are connected to the EEPROM word line to receive read, program, and erase signals.

16. The integrated nonvolatile static random access memory circuit of claim 1 wherein programming to a first data level increases the threshold voltage of the first floating gate tunnel oxide transistor to the programmed threshold voltage level greater than a read voltage level by applying a program signal that is from approximately +15V to approximately +20V to the EEPROM word line and thus to the control gate of the first floating gate tunnel oxide transistor to set the threshold voltage to the programmed voltage threshold level that is greater than a read voltage level for programming and wherein erasing to a second data level, the first floating gate tunnel oxide EEPROM element decreases the threshold voltage of the first floating gate tunnel oxide transistor to an erased threshold voltage level less than the read voltage level by applying an erase signal of from approximately +15V to approximately +20V to the source line of the first floating gate tunnel oxide transistor to set the threshold voltage to the erased threshold voltage level that is less than the read voltage level for erasing.

17. The integrated nonvolatile static random access memory circuit of claim 1 wherein the static random access memory cell comprises:

a latched memory element to retain the data bit at the first data terminal and the complementary data bit a second data terminal, and a first access transistor connected to allow control access of the bit line and a second access transistor connected to allow control access of a complementary bit line to the latched memory element for writing and reading the digital signal to and from the latched memory element, the first and second access transistors having control gates in communication with an SRAM word line for controlling access of the latched memory element to the first and second bit lines; and wherein the first data terminal is connected to a storage node between the first access transistor and the latched memory element to transfer the digital signal to the first EEPROM element.

18. The integrated nonvolatile static random access memory circuit of claim 17 wherein:

the drain of the first floating gate tunnel oxide transistor is connected to the source of the first gating transistor such that when the first select gating signal is activated, the drain of the first floating gate tunnel oxide transistor is connected to the first data terminal of the latched memory element.

19. The integrated nonvolatile static random access memory circuit of claim 18 wherein the static random access memory cell retains the digital signal as volatile digital data by setting the first select gating signal such that the first select gating transistors of the first EEPROM element is deactivated and the static random access memory cell is isolated from the first EEPROM elements.

20. The integrated nonvolatile static random access memory circuit of claim 17 wherein:

a source line signal is applied to the source line for reading, programming, and erasing the first floating gate tunnel oxide transistor.

21. The integrated nonvolatile static random access memory circuit of claim 20 wherein at detection of a powering up of the integrated nonvolatile static random access memory circuit the digital signal retained in the first floating gate tunnel oxide transistor is restored to the static random access memory cell by reading the first EEPROM element.

22. The integrated nonvolatile static random access memory circuit of claim 21 wherein the first EEPROM element is read by the steps of:

setting the source line to a voltage level of a power supply voltage source;

setting the first and second select gating signals to a very large positive voltage level to activate the first and second select gating transistors;

setting the EEPROM word line to a read voltage level to activate the first floating gate tunnel oxide transistor if it is programmed with the data signal at a first data level and to remain inactive if the first floating gate tunnel oxide transistor is programmed with the data signal at a second data level such that if the first floating gate tunnel oxide transistor is activated the first data level is transferred to the static random access memory cell and if the first floating gate tunnel oxide transistor is not activated, the second data level is transferred to the static random access memory cell; and setting the SRAM word line to a voltage level that will not turn on the first and second access transistors to prevent the static random access memory cell from being connected to the bit line and the complementary bit line.

23. The integrated nonvolatile static random access memory circuit of claim 21 wherein subsequent to restoring the digital signal to the static random access memory cell, the EEPROM element is erased.

24. The integrated nonvolatile static random access memory circuit of claim 23 wherein EEPROM element is erased by the steps of:
setting the first select gating signal to a voltage level that will turn off the first select gating transistor to isolate the static random access memory cell from the first EEPROM element;
setting the EEPROM word line to a ground reference voltage level;
setting the second select gating signal and the source line signal to the very large positive voltage level such that charge is extracted from the floating gate of the first floating gate tunnel oxide transistor.

25. The integrated nonvolatile static random access memory circuit of claim 23 wherein subsequent to the erasing the first EEPROM element, the first EEPROM element is isolated from the static random access memory cell and the static random access memory cell is operated in a normal mode.

26. The integrated nonvolatile static random access memory circuit of claim 25 wherein at detection of a powering down of the integrated nonvolatile static random access memory circuit, the digital signal retained in the static random access memory cell is programmed to the first floating gate tunnel oxide transistor.

27. The integrated nonvolatile static random access memory circuit of claim 26 wherein the first EEPROM element is programmed by the steps of:
setting the first select gating signal to the very high positive voltage level to activate the first select gating transistor;
setting the second select gating signal to turn off the second select gating transistor; and
setting the EEPROM word line to the very high positive voltage level such that if the data signal at the first data terminal is the first data level, charge is placed on the floating gate and if the data signal at the first data terminal is the second data level, charge is inhibited from entering the floating gate and the first floating gate tunnel oxide transistor remains erased.

28. The integrated nonvolatile static random access memory circuit of claim 1 wherein:
the control gate of the first floating gate tunnel oxide transistor is connected to the EEPROM word line to receive read, program, and erase signals.

29. A nonvolatile static random access memory array comprising:
a plurality of integrated nonvolatile static random access memory circuits arranged in an array of rows and columns, each of the integrated nonvolatile static random access memory circuits comprising:
a static random access memory cell connected to receive and retain a digital signal indicative of a data bit at a first bit line of a plurality of bit lines and a complementary digital signal indicative of a complementary data bit a second bit line of the plurality of bit lines and in communication with an SRAM word line for controlling access to the first and second bit lines; and
a first EEPROM element in communication with the static random access memory cell to receive and permanently retain the digital signal from the static random access memory cell;
wherein the first EEPROM element comprises:
a first floating gate tunnel oxide transistor comprising an control gate connected to an EEPROM word line for controlling activation of the first floating gate tunnel oxide transistor and a floating gate placed over a channel region between a drain and source of the first floating gate tunnel oxide transistor for permanently retaining the digital signal and placed over an insulating layer wherein the insulating layer has a first tunneling window placed in proximity to the source of the first floating gate tunnel oxide transistor for providing a path for transfer of charge between the floating gate and the source during erasing to set an erased threshold voltage level of the first floating gate tunnel oxide transistor and providing a path for transfer of charge between the floating gate and the channel for programming to set a programmed threshold voltage level of the first floating gate transistor,
a first select gating transistor having a drain connected to the static random access memory cell, a source connected to the drain of the floating gate tunnel oxide transistor, and a gate connected to a first select gating signal for controlling access to the floating gate tunnel oxide transistor, and
a second select gating transistor having a drain connected to the source of the floating gate tunnel oxide transistor, a source connected to a source line, and a control gate connected to a second select gating signal for controlling access between the floating gate tunnel oxide transistor and the source line.

30. The nonvolatile static random access memory array of claim 29 wherein the each of the integrated nonvolatile static random access memory circuit further comprises:
a second EEPROM element in communication with the static random access memory cell through the second data terminal to receive and permanently retain a complement of the digital signal from the static random access memory cell, wherein the second EEPROM element comprises:
a second floating gate tunnel oxide transistor including a control gate connected to the EEPROM word line for controlling activation of the second floating gate tunnel oxide transistor and a floating gate placed over a channel region between a drain and source of the second floating gate tunnel transistor for permanently retaining the complement of the digital signal and placed over an insulating layer wherein the insulating layer has a second tunneling window placed in proximity to the source of the second floating gate tunnel oxide transistor for providing a path for transfer of charge between the floating gate and the source during erasing to set an erased threshold voltage level of the second floating gate tunnel oxide transistor and providing a path for transfer of charge between the floating gate and the channel for programming to set a programmed threshold voltage level of the second floating gate tunnel transistor,
a third select gating transistor having a drain connected to the drain of the second floating gate tunnel oxide transistor, a drain connected to the static random access memory cell, and a gate connected to a first select gating signal for controlling access to the second floating gate tunnel oxide transistor, and
a fourth select gating transistor having a drain connected to the source of the second floating gate tunnel oxide transistor, a source connected to the source line, and a control gate connected to the second select gating signal for controlling access to the second floating gate tunnel oxide transistor from the source line.

31. The nonvolatile static random access memory array of claim 30 wherein programming to the first data level increases the threshold voltage of the second floating gate tunnel oxide transistor to the programmed voltage level greater than a read voltage level by applying a program signal that is from approximately +15V to approximately +20V to the EEPROM word line to set the threshold voltage of a selected row of the first and second floating gate tunnel oxide transistors to the programmed voltage level that is greater than a read voltage level and erasing to a second data level, the second floating gate tunnel oxide EEPROM element decreases the threshold voltage of the second floating gate tunnel oxide transistor to the erased voltage level less than the read voltage level by applying an erase signal of from approximately +15V to approximately +20V to the source line to set the threshold voltage of a selected row of the first and second floating gate tunnel oxide transistors to the erased voltage level that is less than the read voltage level.

32. The nonvolatile static random access memory array of claim 30 further comprising a power detection circuit in communication with the plurality of integrated nonvolatile static random access memory circuits to detect a power interruption and a power initiation and communicate the detection of the power interruption and detection of the power initiation to the plurality of integrated nonvolatile static random access memory circuits.

33. The nonvolatile static random access memory array of claim 32 wherein:
the drain of the first floating gate tunnel oxide transistor is connected to the source of the first gating transistor of the first EEPROM element such that when the first select gating signal is activated the drain of the first floating gate tunnel oxide transistor is connected to first data terminal of the latched memory element; and
the drain of the second floating gate tunnel oxide transistor is connected to the source of the first gating transistor of the second EEPROM element such that when the first select gating signal is activated the drain of the second floating gate tunnel oxide transistor is connected to the second data terminal of the latched memory element.

34. The nonvolatile static random access memory array of claim 30 wherein the static random access memory cell comprises:
a latched memory element to retain the data bit at the first data terminal and the complementary data bit a second data terminal, and
a first access transistor connected to allow control access of the bit line and a second access transistor connected to allow control access of a complementary bit line to the latched memory element for writing and reading the digital signal to and from the latched memory element, the first and second access transistors having control gates in communication with an SRAM word line for controlling access of the latched memory element to the first and second bit lines; and
the first data terminal is connected to a storage node between the first access transistor and the latched memory element to transfer the digital signal to the first EEPROM element; and
the second data terminal is connected to a complementary storage node between the second access transistor and the latched memory element to transfer the digital signal to the second EEPROM element.

35. The nonvolatile static random access memory array of claim 34 wherein:
a source line signal is applied to the source line for reading, programming, and erasing the first and second floating gate tunnel oxide transistors.

36. The nonvolatile static random access memory array of claim 35 wherein the power detection circuit detects the power initiation of the integrated nonvolatile static random access memory circuit the digital signal the complement digital signal retained in the first and second floating gate tunnel oxide transistors are restored to the static random access memory cell by reading the first and second EEPROM elements.

37. The nonvolatile static random access memory array of claim 36 wherein the first and second EEPROM elements are read by the steps of:
setting the source line to a voltage level of a power supply voltage source;
setting the first and second select gating signals to a very large positive voltage level to activate the first and second select gating transistors of the first and second EEPROM elements;
setting the EEPROM word line to a read voltage level to activate the first or second floating gate tunnel oxide transistors if it one is programmed with the data signal at a first data level and to remain inactive if the first or second floating gate tunnel oxide transistor is programmed with the data signal at a second data level such that if the first floating gate tunnel oxide transistor is activated and the second floating gate tunnel oxide transistor is deactivated, the first data level is transferred to the static random access memory cell and if the first floating gate tunnel oxide transistor is not activated and the second floating gate tunnel oxide transistors is activated, the second data level is transferred to the static random access memory cell; and
setting the SRAM word line to a voltage level that will not turn on the first and second access transistors to prevent the static random access memory cell from being connected to the bit line and the complementary bit line.

38. The nonvolatile static random access memory array of claim 36 wherein subsequent to restoring the digital signal to the static random access memory cell, the first and second EEPROM elements are erased.

39. The nonvolatile static random access memory array of claim 38 wherein first and second EEPROM elements are erased by the steps of:
setting the first select gating signal to a voltage level that will turn off the first select gating transistor to isolate the static random access memory cell from the first and second floating gate tunneling oxide EEPROM elements;
setting the EEPROM word line to a ground reference voltage level; and
setting the second select gating signal and the source line signal to the very large positive voltage level such that charge is extracted from the floating gate of the first and second floating gate tunnel oxide transistors.

40. The nonvolatile static random access memory array of claim 38 wherein subsequent to the erasing the first and second EEPROM elements, the first and second EEPROM elements are isolated from the static random access memory cell and the static random access memory cell is operated in a normal mode.

41. The nonvolatile static random access memory array of claim 40 wherein the power detection circuit detects the power interruption of the integrated nonvolatile static random access memory circuit, the digital signal the complementary digital signal retained in the static random access memory cell are programmed to the first and second floating gate tunnel oxide transistors.

42. The nonvolatile static random access memory array of claim 41 wherein the first and second floating gate tunnel oxide EEPROM transistors are programmed by the steps of:
setting the first select gating signal to the very high positive voltage level to activate the first select gating transistor;
setting the second select gating signal to turn off the first select gating transistor; and
setting the EEPROM word line to the very high positive voltage level such that if the data signal at the first data terminal is the first data level, charge is placed on the floating gate of the first floating gate tunnel oxide transistor and charge is inhibited from entering the floating gate of the second floating gate tunnel oxide transistor and if the first data terminal is at the second data level, charge is placed on the floating gate of the second floating gate tunnel oxide transistor and charge is inhibited from entering the floating gate of the first floating gate tunnel oxide transistor.

43. The nonvolatile static random access memory array of claim 34 wherein the static random access memory cell retains the digital signal as volatile digital data by setting the first select gating signal such that the first select gating transistors of the first and second EEPROM elements are deactivated and the static random access memory cell is isolated from the first and second EEPROM elements.

44. The nonvolatile static random access memory array of claim 30 wherein:
the control gates of the first and second floating gate tunnel oxide transistors is connected to the EEPROM word line receive read, program, and erase signals.

45. The nonvolatile static random access memory array of claim 29 wherein programming to a first data level increases a threshold voltage of the first floating gate tunnel oxide transistor to a programmed voltage level greater than a read voltage level by applying a program signal that is from approximately +15V to approximately +20V to the EEPROM word line to set the threshold voltage of a selected row of the selected floating gate tunnel oxide transistors to the programmed voltage level that is greater than a read voltage level and erasing to a second data level, the first floating gate tunnel oxide EEPROM element decreases the threshold voltage of the first floating gate tunnel oxide transistor to an erased voltage level less than the read voltage level by applying an erase signal of from approximately +15V to approximately +20V to the source line to set the threshold voltage of a selected row of the first floating gate tunnel oxide transistors to the erased voltage level that is less than the read voltage level.

46. The nonvolatile static random access memory array of claim 29 further comprising a power detection circuit in communication with the plurality of integrated nonvolatile static random access memory circuits to detect a power interruption and a power initiation and communicate the detection of the power interruption and detection of the power initiation to the plurality of integrated nonvolatile static random access memory circuits.

47. The nonvolatile static random access memory array of claim 46 wherein the static ransom access memory cell is connected to a storage node between the first access transistor and the latched memory element to transfer the digital signal to the first floating gate tunnel oxide EEPROM element.

48. The nonvolatile static random access memory array of claim 47 wherein the static random access memory cell retains the digital signal as volatile digital data by setting the first select gating signal such that the first select gating transistors of the first EEPROM element is deactivated and the static random access memory cell is isolated from the first EEPROM element.

49. The nonvolatile static random access memory array of claim 47 wherein:
a source line signal is applied to the source line for reading, programming, and erasing the first floating gate tunnel oxide transistor.

50. The nonvolatile static random access memory array of claim 49 wherein when the power detection circuit detects the power initiation of the integrated nonvolatile static random access memory array the digital signal retained in the first floating gate tunnel oxide transistor is restored to the static random access memory cell by reading the first EEPROM element.

51. The nonvolatile static random access memory array of claim 50 wherein the first EEPROM element is read by the steps of:
setting the source line to a voltage level of a power supply voltage source;
setting the first and second select gating signals to a very large positive voltage level to activate the first and second select gating transistors;
setting the EEPROM word line to a read voltage level to activate the first floating gate tunnel oxide transistor if it is programmed with the data signal at a first data level and to remain inactive if the first floating gate tunnel oxide transistor is programmed with the data signal at a second data level such that if the first floating gate tunnel oxide transistor is activated the first data level is transferred to the static random access memory cell and if the first floating gate tunnel oxide transistor is not activated, the second data level is transferred to the static random access memory cell; and
setting the SRAM word line to a voltage level that will not turn on the first and second access transistors to prevent the static random access memory cell from being connected to the bit line and the complementary bit line.

52. The nonvolatile static random access memory array of claim 50 wherein subsequent to restoring the digital signal to the static random access memory cell, the EEPROM element is erased.

53. The nonvolatile static random access memory array of claim 52 wherein first floating gate tunnel oxide EEPROM element is erased the by the steps of:
setting the first select gating signal to a voltage level that will turn off the first select gating transistor to isolate the static random access memory cell from the first EEPROM element;
setting the EEPROM word line to a ground reference voltage level;
setting the second select gating signal and the source line signal to the very large positive voltage level such that charge is extracted from the floating gate of the first floating gate tunnel oxide transistor.

54. The nonvolatile static random access memory array of claim 53 wherein subsequent to the erasing the first EEPROM element, the first EEPROM element is isolated from the static random access memory cell and the static random access memory cell is operated in a normal mode.

55. The nonvolatile static random access memory array of claim 54 wherein when the power detection circuit detects a power interruption of the integrated nonvolatile static random access memory circuit, the digital signal retained in the static random access memory cell is programmed to the first floating gate tunnel oxide transistor.

56. The nonvolatile static random access memory array of claim 55 wherein the first EEPROM element is programmed by the steps of:
   setting the first select gating signal to the very high positive voltage level to activate the first select gating transistor;
   setting the second select gating signal to turn off the first select gating transistor; and
   setting the EEPROM word line to the very high positive voltage level such that if the data signal at the first data terminal is the first data level, charge is placed on the floating gate and if the data signal at the first data terminal is the second data level, charge is inhibited from entering the floating gate and the first floating gate tunnel oxide transistor remains erased.

57. The nonvolatile static random access memory array of claim 29 wherein:
   the drain of the first floating gate tunnel oxide transistor is connected to the source of the first gating transistor such that when the first select gating signal is activated the drain of the first floating gate tunnel oxide transistor is connected to the first data terminal of the latched memory element.

58. The nonvolatile static random access memory array of claim 29 wherein:
   the control gate of the first floating gate tunnel oxide transistor is connected to the EEPROM word line to receive read, program, and erase signals.

59. A method for forming an integrated nonvolatile static random access memory comprises the steps of:
   forming a plurality of integrated nonvolatile static random access memory circuits;
      connecting each of the static random access memory cells to one of a plurality first bit lines to receive and retain a digital signal indicative of a data bit;
      connecting each of the static random access memory cells to one of a plurality of complementary bit lines to receive and retain a complementary digital signal indicative of a complementary data bit;
      connecting each of the static random access memory cells to one of a plurality of SRAM word lines for controlling access to the one of the bit lines and complementary bit lines;
      forming a first EEPROM element for each of the integrated nonvolatile static random access memory circuits by the steps of:
         forming a first floating gate tunnel oxide transistor including an EEPROM control gate and a floating gate placed over a channel region between a drain and source of the first floating gate tunnel oxide transistor for permanently retaining the digital signal,
         connecting the control gate to one of a plurality of EEPROM word lines for controlling activation of the first floating gate tunnel oxide transistor,
         placing the floating gate over an insulating layer wherein the insulating layer has a first tunnel window placed in proximity to the source of the first floating gate tunnel oxide transistor for providing a path for transfer of charge between the floating gate and the source during erasing to set an erased threshold voltage level of the first floating gate tunnel oxide transistor and providing a path for transfer of charge between the floating gate and the channel for programming to set a programmed threshold voltage level of the first floating gate tunnel oxide transistor,
      forming a first select gating transistor having a drain connected to the static random access memory cell, a source connected to the drain of the first floating gate tunnel oxide transistor, and a gate connected to one of a plurality of first select gating signals for controlling access between the floating gate tunnel oxide transistor and the static random access memory cell, and
      forming a second select gating transistor having a drain connected to the source of the first floating gate tunnel oxide transistor, a source connected to one of a plurality of a source lines, and a control gate connected to one of a plurality of second select gating signals for controlling access to the first floating gate tunnel oxide transistor from the source line;
   arranging the plurality of integrated nonvolatile static random access memory circuits in an array of rows and columns.

60. The method for forming an integrated nonvolatile static random access memory of claim 59 wherein forming the each of the integrated nonvolatile static random access memory circuit further comprises the steps of:
   forming a second EEPROM element for each of the integrated nonvolatile static random access memory circuits by the steps of:
      forming a second floating gate tunnel oxide transistor including an EEPROM control gate and a floating gate placed over a channel region between a drain and source of the second floating gate tunnel oxide transistor for permanently retaining the digital signal,
      connecting the control gate to the one of EEPROM word lines for controlling activation of the second floating gate tunnel oxide transistor,
      placing the floating gate over an insulating layer wherein the insulating layer has a second tunnel window placed in proximity to the source of the second floating gate tunnel oxide transistor for providing a path for transfer of charge between the floating gate and the source during erasing to set an erased threshold voltage level of the second floating gate tunnel oxide transistor and providing a path for transfer of charge between the floating gate and the channel for programming to set a programmed threshold voltage level of the second floating gate tunnel oxide transistor,
   forming a third select gating transistor having a drain connected to the static random access memory cell, a source connected to the drain of the floating gate tunnel oxide transistor, and a gate connected to one of a plurality of first select gating signals for controlling access to the second floating gate tunnel oxide transistor, and
   forming a fourth select gating transistor having a drain connected to a source of the second floating gate tunnel oxide transistor, a source connected to one of a plurality of source lines, and a control gate connected to one of a plurality of second select gating signals for controlling access to the second floating gate tunnel oxide transistor from the one source line.

61. The method for forming an integrated nonvolatile static random access memory of claim 60 further comprising programming selected first and second EEPROM elements to the first data level by increasing the threshold voltage of the selected second floating gate tunnel oxide transistors to the programmed voltage level greater than a read voltage level by applying a program signal that is from approximately +15V to approximately +20V to the EEPROM word line to set the threshold voltage of a selected row of the first floating gate tunnel oxide transistors to the programmed voltage level that is greater than a read voltage level.

62. The method for forming an integrated nonvolatile static random access memory of claim 60 further comprising erasing the first and second EEPROM element erasing selected second EEPROM elements to a second data level by decreasing the threshold voltage of the second selected floating gate tunnel oxide transistors to the erased voltage level less than the read voltage level by applying an erase signal of from approximately +15V to approximately +20V to the source line to set the threshold voltage of a selected row of the first floating gate tunnel oxide transistors to the erased voltage level that is less than the read voltage level.

63. The method for forming an integrated nonvolatile static random access memory of claim 60 further comprising the steps of;
  detecting a power initiation of the plurality of integrated nonvolatile static random access memory circuits;
  detecting a power interruption of the plurality of integrated nonvolatile static random access memory circuits; and
  communicating the detecting of the power interruption and detecting of the power initiation to the plurality of integrated nonvolatile static random access memory circuits.

64. The method for forming an integrated nonvolatile static random access memory of claim 63 further comprising: restoring the digital signal retained in the first and second floating gate tunnel oxide transistors to the static random access memory cell by reading the first and second EEPROM elements upon detecting the power initiation of the integrated nonvolatile static random access memory circuit.

65. The method for forming an integrated nonvolatile static random access memory of claim 64 wherein the first and second EEPROM elements are read by the steps of:
  setting the source line to a voltage level of a power supply voltage source;
  setting the first and second select gating signals to a very large positive voltage level to activate the first and second select gating transistors of the first and second EEPROM elements;
  setting the EEPROM word line to a read voltage level to activate the first or second floating gate tunnel oxide transistors if it one is programmed with the data signal at a first data level and to remain inactive if the first or second floating gate tunnel oxide transistor is programmed with the data signal at a second data level such that if the first floating gate tunnel oxide transistor is activated and the second floating gate tunnel oxide transistor is deactivated, the first data level is transferred to the static random access memory cell and if the first floating gate tunnel oxide transistor is not activated and the second floating gate tunnel oxide transistors is activated, the second data level is transferred to the static random access memory cell; and
  setting the SRAM word line to a voltage level that will not turn on the first and second access transistors to prevent the static random access memory cell from being connected to the bit line and the complementary bit line.

66. The method for forming an integrated nonvolatile static random access memory of claim 64 wherein erasing the first and second EEPROM elements is subsequent to restoring the digital signal to the static random access memory cell.

67. The method for forming an integrated nonvolatile static random access memory of claim 66 wherein erasing the first and second EEPROM elements comprise the steps of:
  setting the first select gating signal to a voltage level that will turn off the first select gating transistor to isolate the static random access memory cell from the first and second EEPROM elements;
  setting the EEPROM word line to a ground reference voltage level; and
  setting the second select gating signal and the source line signal to the very large positive voltage level such that charge is extracted from the floating gate of the first and second floating gate tunnel oxide transistors.

68. The method for forming an integrated nonvolatile static random access memory of claim 66 further comprises the steps of:
  isolating the first and second EEPROM elements from the static random access memory cell; and
  operating the static random access memory cell in a normal mode subsequent to the erasing the first and second EEPROM elements.

69. The method for forming an integrated nonvolatile static random access memory of claim 68 wherein programming the digital signal the complementary digital signal retained in the static random access memory cell to the first and second floating gate tunnel oxide transistors occurs upon detecting the power interruption of the integrated nonvolatile static random access memory circuit.

70. The method for forming an integrated nonvolatile static random access memory of claim 69 wherein programming the first and second floating gate tunnel oxide transistors comprises the steps of:
  setting the first select gating signal to the very high positive voltage level to activate the first select gating transistor;
  setting the second select gating signal to turn off the first select gating transistor; and
  setting the EEPROM word line to the very high positive voltage level such that if the data signal at the first data terminal is the first data level, charge is placed on the floating gate of the first floating gate tunnel oxide transistor and charge is inhibited from entering the floating gate of the second floating gate tunnel oxide transistor and if the first data terminal is at the second data level, charge is placed on the floating gate of the second floating gate tunnel oxide transistor and charge is inhibited from entering the floating gate of the first floating gate tunnel oxide transistor.

71. The method for forming an integrated nonvolatile static random access memory of claim 59 further comprises programming the first EEPROM elements to a first data level by increasing a threshold voltage of the selected first floating gate tunnel oxide transistors to a programmed voltage level greater than a read voltage level by applying a program signal that is from approximately +15V to approximately +20V to the one EEPROM word line to set the threshold voltage of a selected row of the first floating gate tunnel oxide transistors to the programmed voltage level that is greater than a read voltage level.

72. The method for forming an integrated nonvolatile static random access memory of claim 60 wherein forming each of the integrated nonvolatile static random access memory circuits comprises steps of:
  forming a static random access memory cell for each of the integrated nonvolatile static random access memory circuits by the steps of:
    forming a latched memory element to retain a digital signal indicative of a data bit at a first data terminal and a complementary digital signal indicative of a complementary data bit a second data terminal, and forming a first access transistor connected to allow control access of a bit line and a second access transistor connected to allow control access of a complementary bit line to the latched memory element for writing and reading the digital signal to and from the latched memory element, the first and second access transistors having control gates in communication with an SRAM word line for controlling access of the latched memory element to the first and second bit lines; and connecting each of the static random access memory cells to one of a plurality first bit lines to receive and retain a digital signal indicative of a data bit;

connecting each of the static random access memory cells to one of a plurality of complementary bit lines to receive and retain a complementary digital signal indicative of a complementary data bit;

connecting each of the static random access memory cells to one of a plurality of SRAM word lines for controlling access to the one of the bit lines and complementary bit lines; and the method for forming an integrated nonvolatile static random access memory further comprises the step of connecting the first data terminal to a storage node between the first access transistor and the latched memory element to transfer the digital signal to the first EEPROM element; and connecting the second data terminal to a complementary storage node between the second access transistor and the latched memory element to transfer the digital signal to the second floating gate tunnel oxide EEPROM element.

73. The method for forming an integrated nonvolatile static random access memory of claim 72 wherein:

forming the first floating gate tunnel oxide transistor comprises the step of:

connecting the drain of the first floating gate tunnel oxide transistor to the source of the first gating transistor of the first EEPROM element such that when the first select gating signal is activated the drain of the first floating gate tunnel oxide transistor is connected to the one bit line; and forming the second floating gate tunnel oxide transistor comprises the step of:

connecting the drain of the second floating gate tunnel oxide transistor to the source of the first gating transistor of the second EEPROM element such that when the first select gating signal is activated the drain of the second floating gate tunnel oxide transistor is connected to the one complementary bit line.

74. The method for forming an integrated nonvolatile static random access memory of claim 72 further comprises the step of setting the first select gating signal such that the first select gating transistors of the first and second EEPROM elements are deactivated and the static random access memory cell is isolated from the first and second EEPROM elements so that the static random access memory cell retains the digital signal as volatile digital data.

75. The method for forming an integrated nonvolatile static random access memory of claim 60 wherein forming the first and second floating gate tunnel oxide transistor comprises the step of connecting the control gate of the first and second floating gate tunnel oxide transistor to receive read, program, and erase signals.

76. The method for forming an integrated nonvolatile static random access memory of claim 60 further comprises the step of applying a source line signal to the source line for reading, programming, and erasing the first floating gate tunnel oxide transistor.

77. The method for forming an integrated nonvolatile static random access memory of claim 59 further comprising erasing the first floating gate tunnel oxide EEPROM elements to a second data level by decreasing the threshold voltage of the selected first floating gate tunnel oxide transistors to an erased voltage level less than the read voltage level by applying an erase signal of from approximately +15V to approximately +20V to the one source line to set the threshold voltage of a selected row of the first floating gate tunnel oxide transistors to the erased voltage level that is less than the read voltage level.

78. The method for forming an integrated nonvolatile static random access memory of claim 59 further comprising the steps of;

detecting a power initiation of the plurality of integrated nonvolatile static random access memory circuits;

detecting a power interruption of the plurality of integrated nonvolatile static random access memory circuits; and communicating the detecting of the power interruption and detecting of the power initiation to the plurality of integrated nonvolatile static random access memory circuits.

79. The method for forming an integrated nonvolatile static random access memory of claim 78 further comprising restoring the digital signal retained in the first floating gate tunnel oxide transistor to the static random access memory cell by reading the first EEPROM element upon detecting the power initiation of the integrated nonvolatile static random access memory circuit.

80. The method for forming an integrated nonvolatile static random access memory of claim 79 wherein reading the first EEPROM element comprises the steps of:

setting the source line to a voltage level of a power supply voltage source;

setting the first and second select gating signals to a very large positive voltage level to activate the first and second select gating transistors;

setting the EEPROM word line to a read voltage level to activate the first floating gate tunnel oxide transistor if it is programmed with the data signal at a first data level and to remain inactive if the first floating gate tunnel oxide transistor is programmed with the data signal at a second data level such that if the first floating gate tunnel oxide transistor is activated the first data level is transferred to the static random access memory cell and if the first floating gate tunnel oxide transistor is not activated, the second data level is transferred to the static random access memory cell; and setting the SRAM word line to a voltage level that will not turn on the first and second access transistors to prevent the static random access memory cell from being connected to the bit line and the complementary bit line.

81. The method for forming an integrated nonvolatile static random access memory of claim 79 further comprising the step of erasing the first EEPROM element, subsequent to restoring the digital signal to the static random access memory cell.

82. The method for forming an integrated nonvolatile static random access memory of claim 81 further comprises the steps of:

isolating the first EEPROM element from the static random access memory cell; and operating the static random access memory cell in a normal mode, subsequent to the erasing the first floating gate tunnel oxide EEPROM element.

83. The method for forming an integrated nonvolatile static random access memory of claim 81 wherein erasing the first EEPROM element comprises the steps of:
setting the first select gating signal to a voltage level that will turn off the first select gating transistor to isolate the static random access memory cell from the first EEPROM element;
setting the EEPROM word line to a ground reference voltage level;
setting the second select gating signal and the source line signal to the very large positive voltage level such that charge is extracted from the floating gate of the first floating gate tunnel oxide transistor.

84. The method for forming an integrated nonvolatile static random access memory of claim 83 further comprising the steps of programming the digital signal retained in the static random access memory cell to the first floating gate tunnel oxide transistor detects the power interruption of the integrated nonvolatile static random access memory circuit.

85. The method for forming an integrated nonvolatile static random access memory of claim 84 wherein programming the first EEPROM element comprises the steps of:
setting the first select gating signal to the very high positive voltage level to activate the first select gating transistor;
setting the second select gating signal to turn off the first select gating transistor; and
setting the EEPROM word line to the very high positive voltage level such that if the data signal at the first data terminal is the first data level, charge is placed on the floating gate and if the data signal at the first data terminal is the second data level, charge is inhibited from entering the floating gate and the first floating gate tunnel oxide transistor remains erased.

86. The method for forming an integrated nonvolatile static random access memory of claim 59 wherein forming each of the integrated nonvolatile static random access memory circuits comprises steps of:
forming a static random access memory cell for each of the integrated nonvolatile static random access memory circuits by the steps of:
forming a latched memory element to retain a digital signal indicative of a data bit at a first data terminal and a complementary digital signal indicative of a complementary data bit a second data terminal, and
forming a first access transistor connected to allow control access of a bit line and a second access transistor connected to allow control access of a complementary bit line to the latched memory element for writing and reading the digital signal to and from the latched memory element, the first and second access transistors having control gates in communication with an SRAM word line for controlling access of the latched memory element to the first and second bit lines; and
connecting each of the static random access memory cells to one of a plurality first bit lines to receive and retain a digital signal indicative of a data bit;
connecting each of the static random access memory cells to one of a plurality of complementary bit lines to receive and retain a complementary digital signal indicative of a complementary data bit;
connecting each of the static random access memory cells to one of a plurality of SRAM word lines for controlling access to the one of the bit lines and complementary bit lines; and
the method for forming an integrated nonvolatile static random access memory further comprises the step of connecting the first data terminal to a storage node between the first access transistor and the latched memory element to transfer the digital signal to the first EEPROM element.

87. The method for forming an integrated nonvolatile static random access memory of claim 86 forming the first floating gate tunnel oxide transistor comprises the step of:
connecting the drain of the first floating gate tunnel oxide transistor to the source of the first gating transistor such that when the first select gating signal is activated the drain of the first floating gate tunnel oxide transistor is connected to the one bit line.

88. The method for forming an integrated nonvolatile static random access memory of claim 86 further comprises the step of setting the first select gating signal such that the first select gating transistors of the first EEPROM element is deactivated and the static random access memory cell is isolated from the first EEPROM elements so that the static random access memory cell retains the digital signal as volatile digital data.

89. The method for forming an integrated nonvolatile static random access memory of claim 59 wherein forming the first floating gate tunnel oxide transistor comprises the step of connecting the control gate of the first floating gate tunnel oxide transistor to receive read, program, and erase signals.

90. The method for forming an integrated nonvolatile static random access memory of claim 59 further comprises the step of applying a source line signal to the source line for reading, programming, and erasing the first floating gate tunnel oxide transistor.

* * * * *